(12) United States Patent
Kuroi et al.

(10) Patent No.: US 6,232,187 B1
(45) Date of Patent: May 15, 2001

(54) SEMICONDUCTOR DEVICE AND MANUFACTURING METHOD THEREOF

(75) Inventors: Takashi Kuroi; Hirokazu Sayama, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/280,992

(22) Filed: Mar. 30, 1999

Related U.S. Application Data

(62) Division of application No. 08/745,555, filed on Nov. 12, 1996, now abandoned.

(30) Foreign Application Priority Data

May 22, 1996 (JP) .................................................. 8-127127

(51) Int. Cl.[7] ........................ H01L 21/336; H01L 21/425
(52) U.S. Cl. ......................... 438/287; 438/302; 438/525
(58) Field of Search ..................................... 438/302, 525, 438/287

(56) References Cited

U.S. PATENT DOCUMENTS

| 4,868,619 | | 9/1989 | Mukherjee et al. . |
|---|---|---|---|
| 5,237,188 | * | 8/1993 | Iwai et al. . |
| 5,369,297 | | 11/1994 | Kusunoki et al. . |
| 5,496,751 | * | 3/1996 | Wei et al. . |
| 5,516,707 | * | 5/1996 | Loh et al. . |
| 5,674,788 | | 10/1997 | Wristers et al. . |
| 5,750,435 | * | 5/1998 | Pan . |
| 5,780,330 | * | 7/1998 | Choi . |

FOREIGN PATENT DOCUMENTS

| 4-116869 | 4/1992 | (JP) . |
|---|---|---|
| 5-304300 | 11/1993 | (JP) . |
| 7-30113 | 1/1995 | (JP) . |
| 93-6976 | 4/1993 | (KR) . |

OTHER PUBLICATIONS

"The Impact of Nitrogen Implantation into Highly Doped Polysilicon Gates for Highly Reliable and High–Performance Sub–Quarter–Micron Dual–Gate Complementary Metal Oxide Semiconductor", T. Kuroi et al., Jpn. J. Appl. Phys. vol. 34, Part 1, No. 2B, Feb. 1995, pp. 771–775.

"Impact of Nitrogen Implantation on Highly Reliable Sub–Quarter–Micron Metal Oxide Field–Effect Transistors (MOSFETs) with Lightly Doped Drain Structure", S. Shimizu et al., Jpn. J. Appl. Phys. vol. 35, Part 1, No. 2B, Feb. 1996, pp. 802–806.

* cited by examiner

Primary Examiner—Richard Booth
Assistant Examiner—Ron Pompey
(74) Attorney, Agent, or Firm—McDermott, Will & Emery

(57) ABSTRACT

A highly reliable semiconductor device and a manufacturing method thereof are provided, without lowering the mobility of carriers, by increasing the nitrogen concentration of part of a gate insulating film. Nitrogen containing regions containing nitrogen are provided on both end portions of a gate insulating film which is formed into a uniform thickness.

8 Claims, 41 Drawing Sheets

SEMICONDUCTOR DEVICE AND MANUFACTURING METHOD THEREOF

This application is a divisional of application Ser. No. 08/745,555 filed Nov. 12, 1996 now abandoned.

BACKGROUND OF THE INVENTION

1. Field of the Invention

The present invention relates generally to semiconductor devices and manufacturing methods thereof, and more particularly to a semiconductor device having a reliability improved by introducing nitrogen into a part of a gate insulating film and a manufacturing method thereof.

2. Description of the Background Art

In the manufacture of semiconductor devices, it is a significant object to secure the reliability of a gate insulating film in an MOSFET (Metal Oxide Semiconductor Field Effect Transistor). One factor of deterioration of the reliability of a gate insulating film is hot carriers injected into the gate insulating film. As the size of a semiconductor device decreases, the electric field in the direction along a channel region in the semiconductor device is enhanced, and carriers present in the channel region are accelerated by the electric field and have high energy. The carriers with such high energy are hot carriers. The hot carriers having the high energy can easily be injected into the gate insulating film over the energy barrier at the interface between the semiconductor substrate and the gate insulating film.

The carriers injected into the gate insulating film are partly captured into the gate oxide film or generate a surface level, thereby changing the threshold voltage of the semiconductor device or lowering the current driving capability.

In order to prevent the reliability of a semiconductor device from degrading by the hot carriers, use of an oxynitride film as a gate insulating film has been proposed. Use of an oxynitride film for a gate insulating film improves the resistance against hot carriers as well as improves the amount of charges injected until the gate insulating film breaks down, and therefore the dopant in the gate electrode may be prevented from penetrating through the gate insulating film and diffusing within the semiconductor substrate.

Now, referring to FIG. 69, the structure of a conventional MOSFET will briefly be described. In a p well region 8 formed in an N type semiconductor substrate 1, an n⁺ drain diffusion region 3a and an n⁺ source diffusion region 3b are formed a prescribed space apart from each other with a channel region therebetween. Adjacent to n⁺ drain diffusion region 3a and n⁺ source diffusion region 3b on the side of the channel region, n⁻ LDD layers 2a and 2b having an LDD structure are formed. On the channel region, a gate electrode 5 is formed with a gate insulating film 4b formed of an oxynitride film therebetween.

A method of manufacturing such an MOSFET will briefly be described in conjunction with FIGS. 70 to 73.

Referring to FIG. 70, an element isolation insulating film 6 is formed on n type semiconductor substrate 1 by selective oxidation. Then, a p type impurity such as boron ions is implanted into n type semiconductor substrate 1 a number of times in different implantation energies to form p well 8 while controlling the threshold voltage of the MOSFET.

Referring to FIG. 71, a surface of n type semiconductor substrate is oxidized by thermal oxidation to form gate oxide film 4. Then, n type semiconductor substrate 1 is subjected to thermal treatment in a nitrogen dioxide-containing atmosphere in order to nitrogenize gate insulating film 4, and oxynitride film 4b results.

Now, referring to FIG. 72, a polycrystalline silicon film doped with phosphorus is formed on oxynitride film 4, and a resist film patterned into a prescribed shape is formed on the polycrystalline silicon film by means of photolithography. The polycrystalline silicon film is patterned using the resist film to form gate electrode 5. The resist film is then removed away, and using the gate electrode 5 as mask, a substance such as arsenic is implanted into p well 8 to form n⁻ LDD layer 2a, 2b.

Referring to FIG. 73, a side wall oxide film 7 is formed on a sidewall of gate electrode 5, and then using sidewall oxide film 7 and gate electrode 5 as mask, p well 8 is implanted with arsenic to form drain diffusion region 3a and source diffusion region 3b. Then prescribed heat treatment follows to complete the MOSFET shown in FIG. 69.

A non-volatile semiconductor memory device is one of semiconductor integrated circuit devices. Above all, an EEPROM (Electrically Erasable and Programmable Read Only Memory) which permits free programming of data as well as electrical writing and erasing is well known. In such an EEPROM, a flash EEPROM which permits batch erasing of information written therein is disclosed for example by U.S. Pat. No. 4,868,619.

In the flash EEPROM, when data is written or erased, electrons are passed through the gate insulating film by the tunnelling effect, and the electrons injected into the gate insulating film are partially captured therein or sometimes generate a surface level in the interface between the gate insulating film and the semiconductor substrate. As a result, the threshold voltage of the flash EEPROM changes, and the current driving capability is lowered. In order to restrain such degrading of the reliability of the gate insulating film, use of an oxynitride film for the gate insulating film has been proposed.

The structure of a conventional flash EEPROM using an oxynitride film for the gate insulating film will briefly be described in conjunction with FIG. 74.

The conventional flash EEPROM has a drain diffusion region 103a and a source diffusion region 103b spaced apart from each other on a p type semiconductor substrate 101 with a channel region therebetween. On the channel region, a charge accumulating electrode 105 is formed with a gate insulating film 104b inbetween, and on charge accumulating electrode 105, a control electrode 108 for electrically isolating charge accumulating electrode 105 is formed with an interlayer insulating film 107 inbetween. A sidewall oxide film 110 is formed on sidewalls of charge accumulating electrode 105 and control electrode 108.

A method of manufacturing the flash EEPROM will briefly be described in conjunction with FIGS. 75 to 79.

Referring to FIG. 75, a surface of p type semiconductor substrate 101 is oxidized by means of thermal oxidation, and a gate oxide film is formed. Thereafter, gate oxide film is nitrogenized to form an oxynitride film 104b by means of thermal treatment in an atmosphere containing ammonia.

Then, referring to FIG. 76, on oxynitride film 104b formed is a first polycrystalline silicon film doped with phosphorus, on which an interlayer insulating film formed of a composite film of an oxide film and a nitride film is formed. Then, a second polycrystalline silicon film doped with phosphorus is formed on interlayer insulating film.

A resist film patterned into a prescribed shape is formed by means of photolithography on the second polycrystalline silicon film. Then, using the resist film as mask, the second polycrystalline silicon film, interlayer insulating film and the first polycrystalline silicon film are etched, the resist film is removed away, and thus control electrode 108, interlayer insulating film 107 and charge accumulating electrode 105 are formed.

Now, referring to FIG. 77, a resist film 109 covering a region to be a drain diffusion region is formed, and using control electrode 108 and resist film 109 as mask, p type semiconductor substrate 101 is implanted with arsenic ions. A source diffusion region 103b is formed in p type semiconductor substrate 101 as a result.

Now referring to FIG. 78, after removal of resist film 109, a sidewall oxide film 110 is formed on sidewalls of control electrode 108 and charge accumulating electrode 105. Then, a resist film 111 covering source diffusion region 103b is formed, and using control electrode 108 and resist film 111 as mask, p type semiconductor substrate 101 is implanted with arsenic ions. As a result, a drain diffusion region 103a is formed in p type semiconductor substrate 101. Then, the semiconductor substrate is thermally treated to complete the flash EEPROM shown in FIG. 79.

The use of an oxynitride film for the gate insulating film in the manufacture of MOSFETs is encountered with the following disadvantages.

An oxynitride film is used in order to improve the resistance of an MOSFET against hot carriers, but at an increased nitrogen concentration for the gate insulating film in the range from several atm % to 10 odd atm %, (i) stress is caused within the gate insulating film by nitrogen entering into the gate insulating film; and (ii) the roughness of the interface between the gate insulating film and the semiconductor substrate increases.

For the above reasons, a surface level is generated in the channel region of the MOSFET, carrier trap is generated, the mobility of carriers decreases, which results in a lowered current driving capability of the MOSFET, and a lowered operation speed.

Also in the flash EEPROM, for the same reasons as for the MOSFET, the speed of writing in the flash EEPROM decreases.

SUMMARY OF THE INVENTION

It is an object of the present invention to provide a highly reliable semiconductor device by increasing the temperature of nitrogen in a prescribed region in a gate insulating film and preventing the mobility of carriers in a channel region from lowering, and a manufacturing method thereof.

In one aspect of the present invention, the semiconductor device includes, on a main surface of a semiconductor substrate of first type conductivity, a pair of impurity regions of second type conductivity opposite to the first type conductivity with a prescribed space apart from each other, a channel region formed between the pair of impurity regions, an insulating film formed on the channel region, and a first electrode formed on the insulating film. The insulating film having a uniform thickness has a region containing nitrogen on both ends in contact with the pair of impurity regions.

A method of manufacturing a semiconductor device according to the present invention in one aspect includes the following steps.

An insulating film is formed in a main surface of a semiconductor substrate of first type conductivity. Then, a first electrode is formed on the insulating film.

The insulating film and the first electrode are patterned into a prescribed shape by means of photolithography. Then, a pair of impurity regions are formed in the semiconductor substrate by introducing an impurity of second type conductivity opposite to the first type conductivity using the first electrode as mask.

A nitrogen containing region is formed at both ends of the insulating film by thermal treatment in an atmosphere containing a gas containing nitrogen.

According to the above-described semiconductor device and the manufacturing method thereof, the nitrogen containing region is formed only in the vicinity of the lower edge portion of the first electrode, in other words only in the insulating film in the region implanted with hot carriers. Therefore, since a surface level is kept from being generated between the insulating film in the vicinity of the lower edge portion of the first electrode implanted with hot carriers and the semiconductor substrate, and carrier trap in the vicinity of the lower edge portion of the first electrode in the insulating film may be reduced, use of the semiconductor device for an MOSFET may reduce the deterioration of the insulating film caused by injected hot carriers may be reduced.

In addition, since the nitrogen containing region is not formed in the lower region in the center of the first electrode, decrease in the mobility of carriers in the channel region may be prevented. As a result, a highly reliable MOSFET having a high driving capability may be provided.

The insulating film in the semiconductor device has a uniform thickness, decrease in the current driving capability caused by gate bird's beaks as encountered in conventional techniques can be prevented.

Use of the semiconductor device for a flash EEPROM may reduce the deterioration of an insulating film caused by writing and erasure to/from the flash EEPROM. In addition, since decrease in the mobility of carriers in the channel region may be restrained, a highly reliable flash EEPROM having a high driving capability may be implemented.

More preferably, the insulating film has a low concentration nitrogen containing region between the nitrogen containing regions. The region has a lower nitrogen concentration than the nitrogen containing region.

Use of such a structure prevents dopant in the first electrode from transmitting through the insulating film and diffusing into the semiconductor substrate, and the operation characteristics of the semiconductor device may be stabilized.

More preferably, a nitrogen impurity layer formed to extend from the nitrogen containing region formed in the insulating film to the semiconductor substrate is formed in the pair of impurity regions.

If such a structure with a nitrogen impurity layer is applied to a semiconductor device having an LDD structure, for example, the impurity diffusion of the LDD region may be restrained, and as a result, the short channel effect in a semiconductor device may be prevented.

More preferably, the first electrode contains nitrogen. In the first electrode containing nitrogen, the diffusion coefficient of dopant within the first electrode becomes relatively small, thus restraining the diffusion of the dopant into the semiconductor substrate.

In another aspect of the semiconductor device according to the present invention, the insulation film has a nitrogen containing region containing nitrogen at both ends in contact with a pair of impurity regions, and a low concentration nitrogen containing region having a nitrogen impurity concentration lower than the nitrogen containing region in the region between the nitrogen containing regions, with the thickness of the lower concentration nitrogen containing region being larger than the nitrogen containing region. By providing the nitrogen containing region positioned at both ends of the first electrode to be thick, resistance against hot carriers may be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, semiconductor devices according to embodiments of the invention and manufacturing methods thereof will be described in conjunction with the accompanying drawings.

First Embodiment

A semiconductor device according to a first embodiment of the invention and a manufacturing method thereof will be described with reference to figures.

Figure 1:
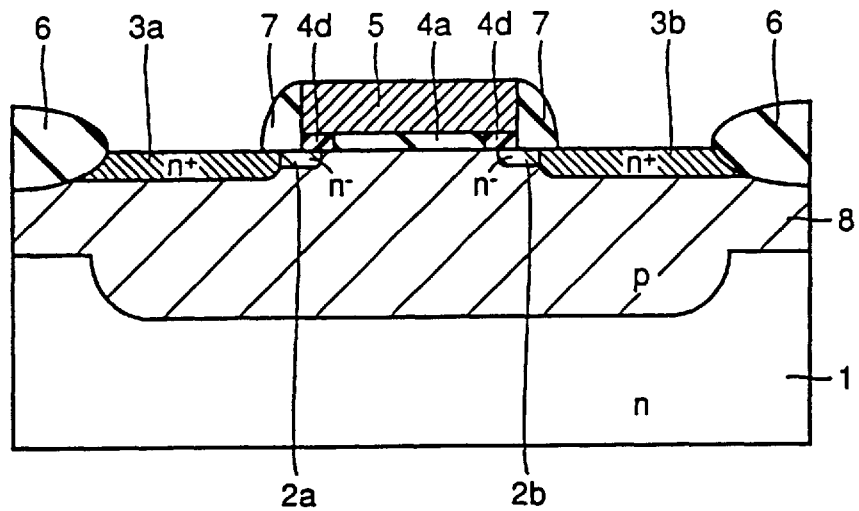
FIG. 1 is a cross sectional view showing the structure of a semiconductor device according to a first embodiment of the invention.

FIG. 1 is a cross sectional view schematically showing an MOSFET according to the first embodiment invention.

A p well 8 is formed on an n type semiconductor substrate 1 such as of a silicon substrate, and an active region is defined by an element isolation insulating film 6. In p well 8, an $n^+$ type drain diffusion region 3a and an $n^+$ type source diffusion region 3b are formed a prescribed space apart from each other with a channel region therebetween. $N^-$ type LDD layers 2a and 2b are formed in $n^-$ type drain diffusion region 3a and $n^+$ type source diffusion region 3b on the side of channel region, respectively.

A gate electrode 5 is formed on the channel region with a gate insulating film 4a such as of an oxide film therebetween.

Figure 2:
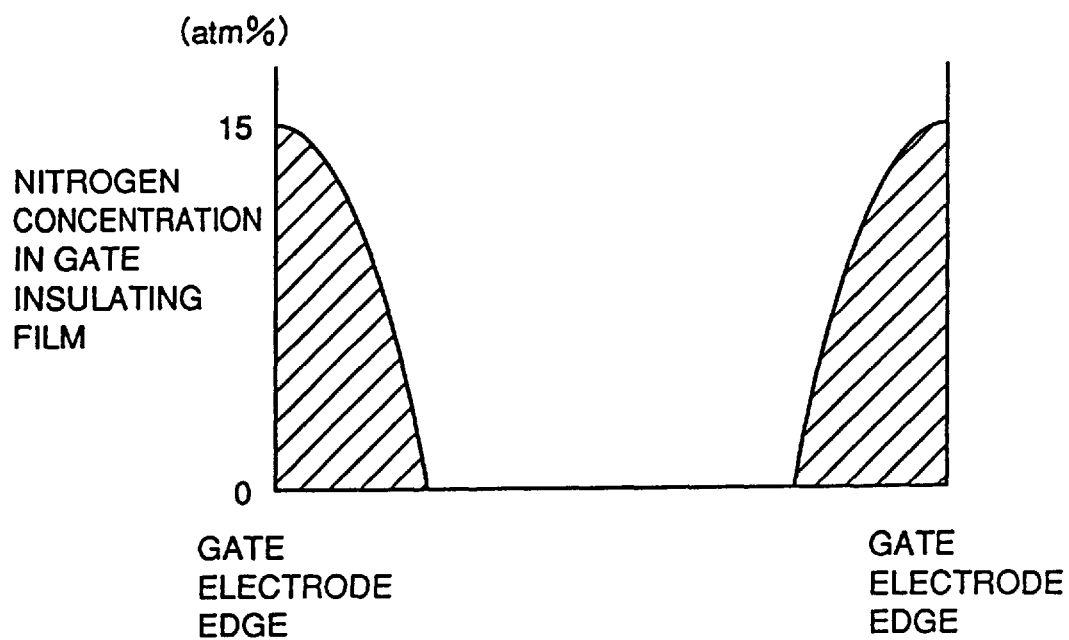
FIG. 2 is a graph showing the nitrogen concentration in a gate insulating film.

There is provided a gate insulating film 4d in contact with the lower edge portion of gate electrode 5, in other words a gate insulating film 4a in the vicinity of the region in contact with the $n^-$ type LDD layer 2a of $n^+$ type drain diffusion region 3a and the $n^-$ type LDD layer 2b of $n^+$ type source diffusion region 3b has a nitrogen containing region 4d as shown in the profile of nitrogen concentration for gate insulating film 4a in FIG. 2.

Figure 3:
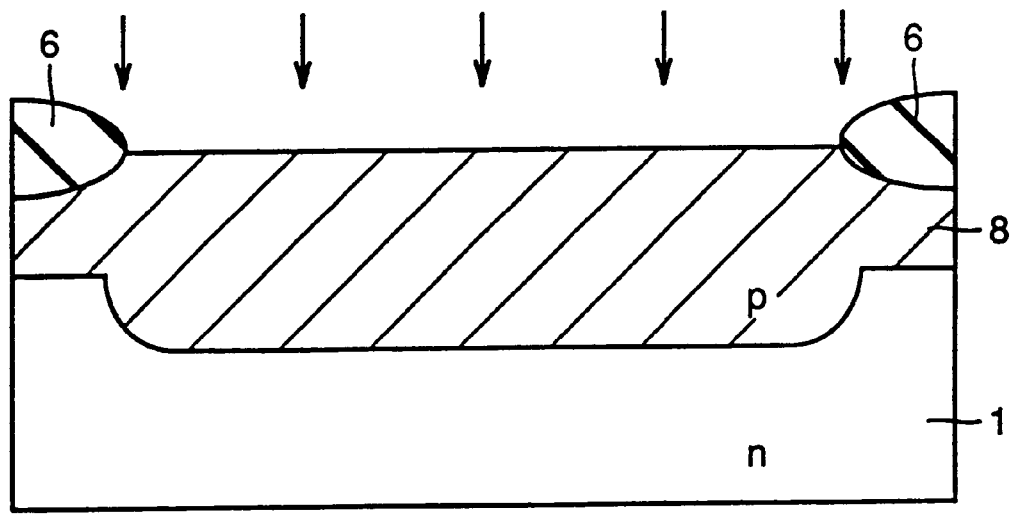
FIGS. 3 to 7 are cross sectional views showing first to fifth steps in a method of manufacturing the semiconductor device according to the first embodiment.

A method of manufacturing the semiconductor device will be described in conjunction with FIGS. 3 to 7. Referring to FIG. 3, element isolation oxide film 6 is formed on n type semiconductor substrate 1 by selective oxidation, then boron ions are implanted in multiple stages with various implantation energies to form p well 8 while controlling the threshold voltage of the MOSFET.

Figure 4:
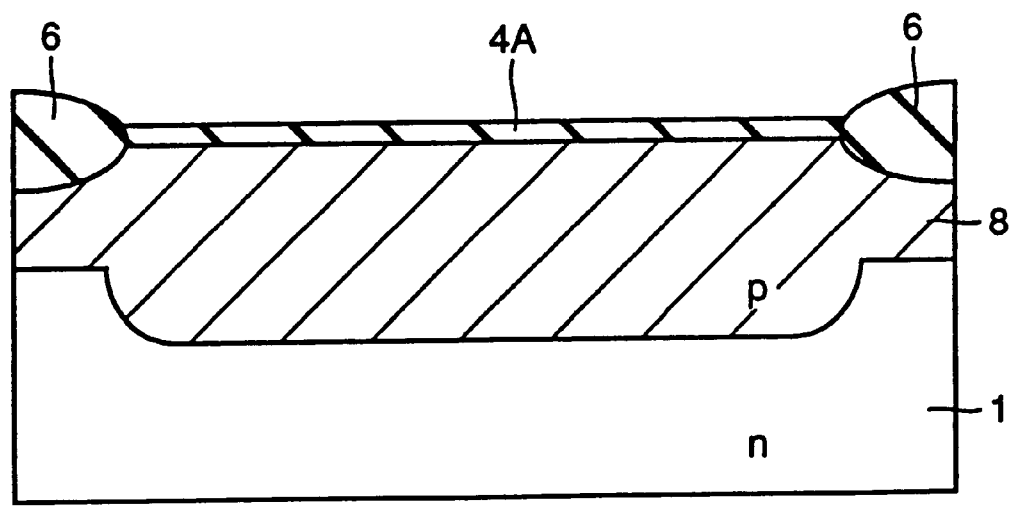

Now, referring to FIG. 4, n type semiconductor substrate 1 is thermally oxidized to form a gate oxide film 4a having a thickness in the range from 40 Å to 100 Å.

Figure 5:
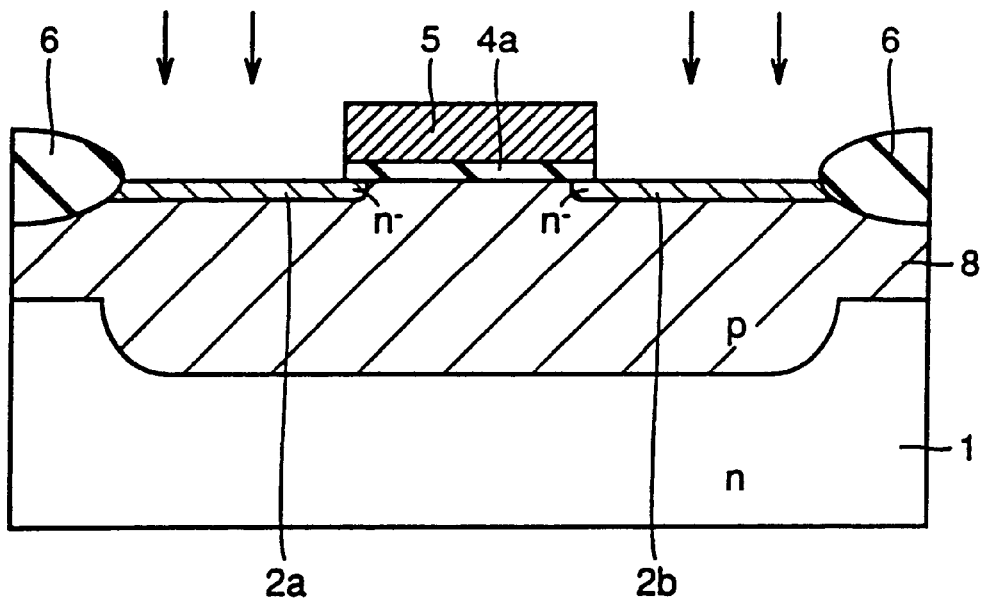

Now, referring to FIG. 5, a polycrystalline silicon file 5 doped with phosphorus is formed and resist is applied into a film entirely on polycrystalline silicon film 5, and patterning into a prescribed shape is conducted by means of photolithography.

Using the resist film as mask, polycrystalline silicon film 5 and gate oxide film 4 are etched, then the resist is removed away to complete gate electrode 5 and gate insulating film 4a. Thereafter, using gate electrode 5 as mask, p well 8 is implanted with arsenic ions to form n⁻ type LDD layers 2a and 2b.

Figure 6:
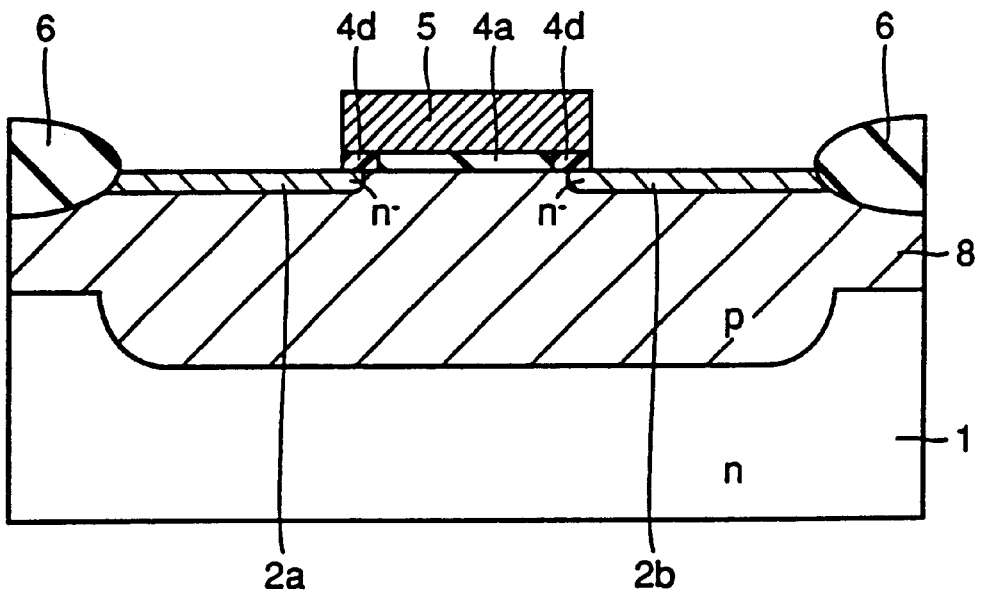

Now, referring to FIG. 6, in an atmosphere containing ammonia, gate insulating film 4a is thermally treated at a temperature in the range from 600° C. to 900° C. (preferably at 800° C.), and gate oxide film 4a in the region in contact with the lower edge portion of gate electrode 5 is nitrided to form nitrogen containing region 4d.

Figure 7:
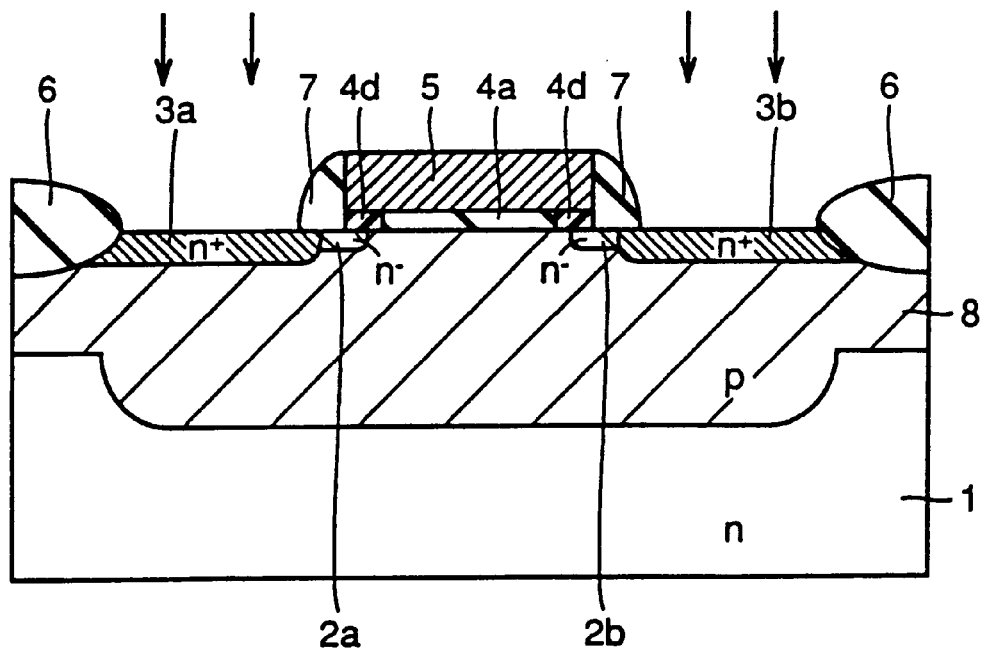

Then, referring to FIG. 7, a sidewall oxide film 7 is formed on a sidewall of gate electrode 4, using gate electrode 5 and sidewall oxide film 7 as mask, p well 8 is implanted with arsenic ions to form n⁺ type drain region 3a and n⁺ type source region 3b, and the MOSFET shown in FIG. 3 is completed by thermal treatment.

In the MOSFET according to the first embodiment, nitrogen containing region 4d is formed only in the region in the vicinity of the lower edge portion of gate electrode 5, in other words only in the region implanted with hot carriers.

As a result, a surface level is restrained from being generated between gate insulting film 4a in the vicinity of the lower edge portion of the gate electrode implanted with hot carriers and n type semiconductor substrate 1, carrier trap in gate insulating film 4a in the vicinity of the lower edge portion of gate electrode 5 may be reduced, and therefore the deterioration of the MOSFET by hot carrier implantation may be reduced.

Since nitrogen containing region 4d is formed only at both ends of gate insulating film 4a, the mobility of carriers may be restrained from being lowered. In addition, gate insulating film 4a having a uniform thickness may eliminate the lowering of the current driving capability caused by gate bird's beaks as encountered in the conventional structure. Therefore, in the semiconductor device according to the first embodiment, a highly reliable MOSFET having high driving capability may be implemented.

Second Embodiment

Now, a semiconductor device according to a second embodiment of the invention and a manufacturing method thereof will be described in conjunction with figures.

Figure 8:
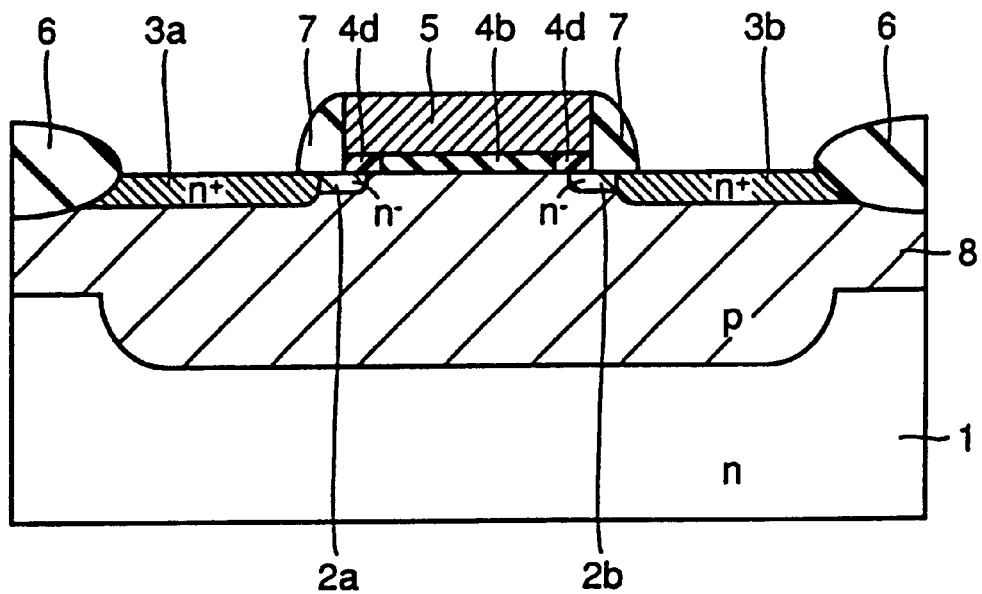
FIG. 8 is a cross sectional view showing the structure of a semiconductor device according to a second embodiment of the invention.

FIG. 8 is a cross sectional view schematically showing an MOSFET according to the second embodiment of the invention.

Figure 9:
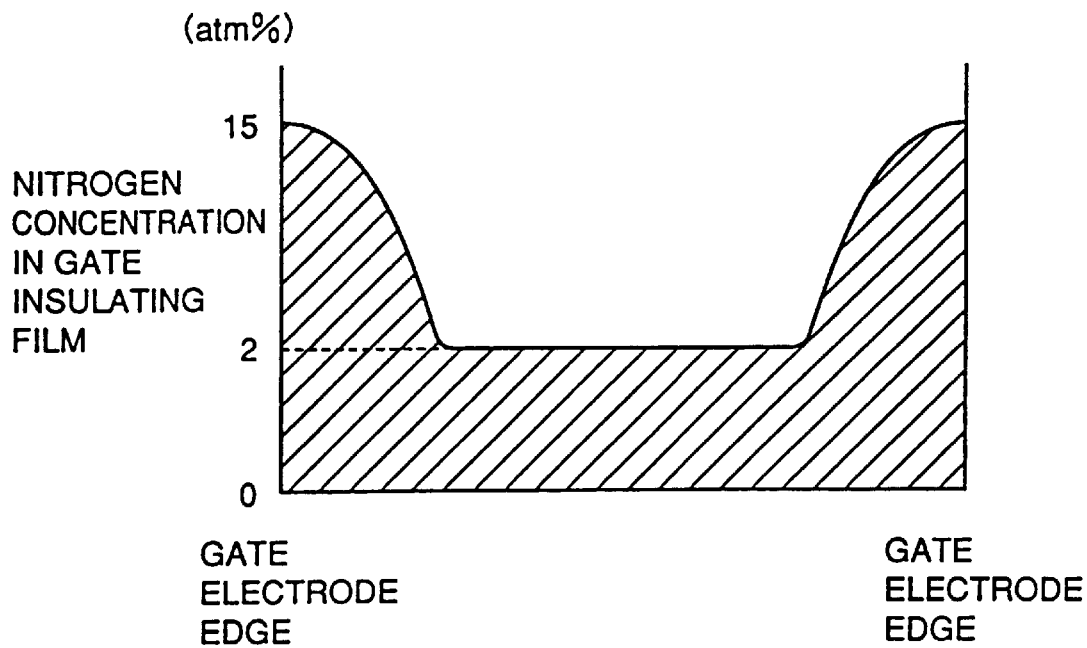
FIG. 9 is a graph showing the nitrogen concentration in a gate insulating film.

The structure of the MOSFET according to the second embodiment is substantially the same as the structure of the MOSFET according to the first embodiment shown in FIG. 1 with an essential difference being that there is provided a low concentration nitrogen containing region with a nitrogen impurity in a lower concentration than nitrogen containing region 4d as shown in the profile of the nitrogen concentration in the gate insulating film shown in FIG. 9 also in the region between the nitrogen containing regions 4d of gate insulating film. The other structure is essentially the same as that of the MOSFET according to the first embodiment, and the same or corresponding portions are denoted with the same reference numerals and characters.

Now, referring to FIGS. 10 to 14, a method of manufacturing the MOSFET according to the second embodiment of the invention will be described.

Figure 10:
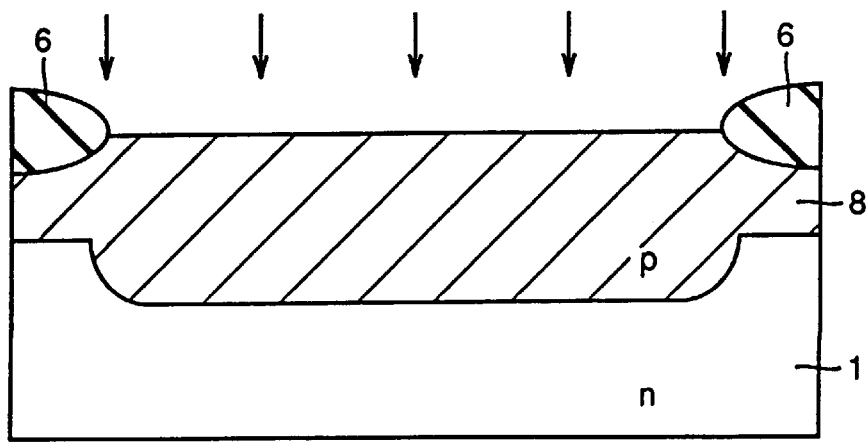
FIGS. 10 to 14 are cross sectional views showing first to fifth steps in a method of manufacturing the semiconductor device according to the second embodiment.

Referring to FIG. 10, an element isolation oxide film 6 is formed on n type semiconductor substrate 1 by selective oxidation, and then boron ions are implanted in multiple stages with various implantation energies to form p well 8, while controlling the threshold voltage of the MOSFET.

Figure 11:
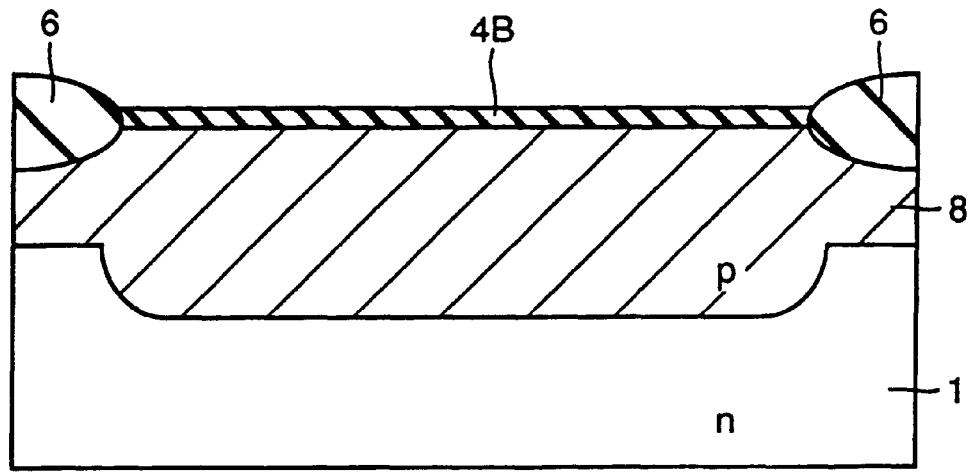

Now, referring to FIG. 11, a surface of n type semiconductor substrate 1 is thermally oxidized to form a gate oxide film, followed by thermal treatment in an ammonia containing atmosphere at a temperature in the range from 600° C. to 900° C. to form an oxynitride film 4B.

Figure 12:
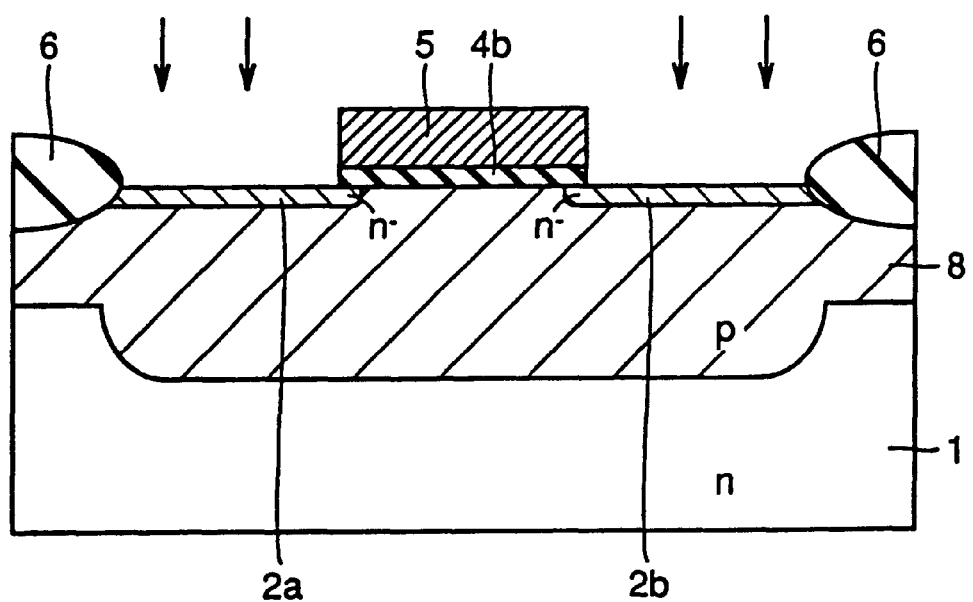

Now, referring to FIG. 12, a polycrystalline silicon film doped with phosphorus is formed on oxynitride film 4B, on which a resist film patterned into a prescribed shape by means of photolithography is formed. Then, using the resist film as mask, the polycrystalline silicon film and oxynitride film 4B are etched, the resist film is removed away, and gate electrode 5 and oxynitride film 4b are completed.

Now, using gate electrode 5 as mask, p well 8 is implanted with arsenic ions to form n⁻ type LDD layers 2a and 2b.

Figure 13:
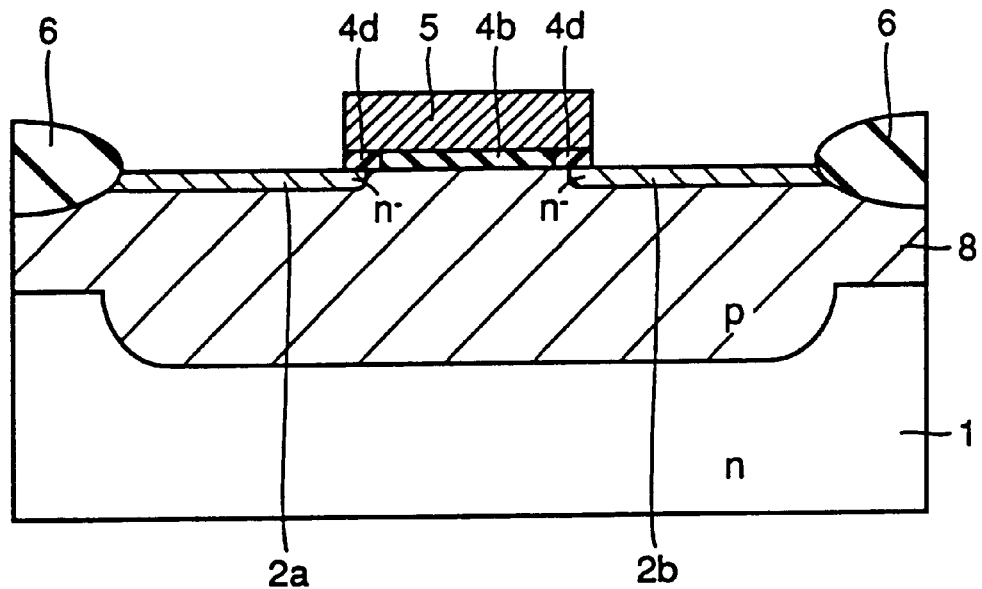

Now, referring to FIG. 13, oxynitride film 4b is subjected to thermal treatment in an ammonia containing atmosphere at a temperature in the range from 600° C. to 900° C., oxynitride film 4b in the region in contact with the lower edge portion of gate electrode 5 is nitrided, and nitrogen containing region 4d having a higher nitrogen concentration in the vicinity of the lower edge portion of gate electrode 5 than the central region is formed.

Figure 14:
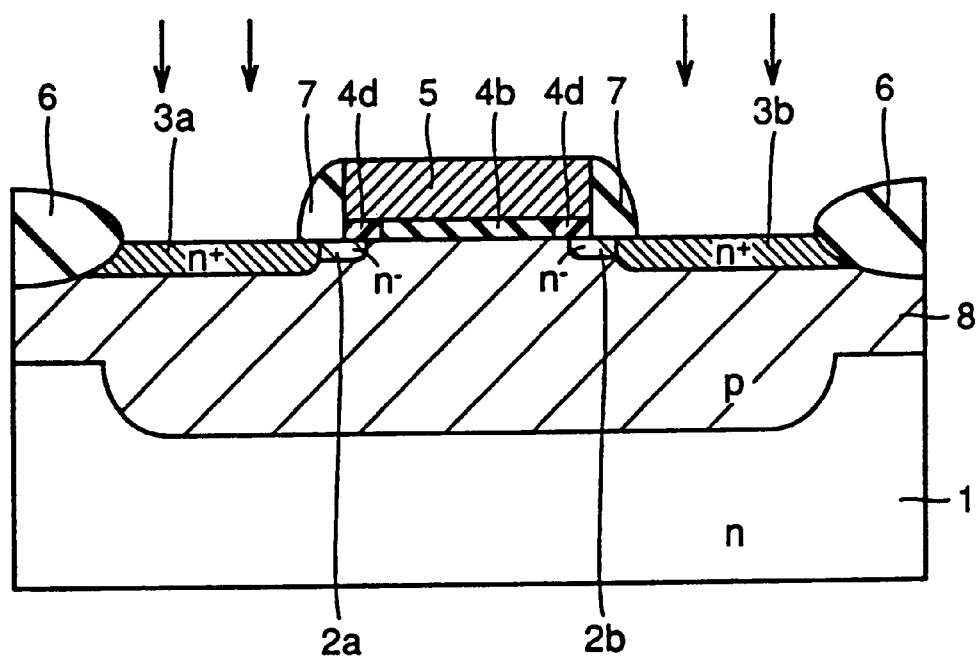

Now, referring to FIG. 14, after sidewall oxide film 7 is formed on a sidewall of gate electrode 5, using gate electrode 5 and sidewall oxide film 7 as mask, p well 8 is implanted with arsenic ions to form n⁺ type drain diffusion region 3a and n⁺ type source diffusion region 3b, and then thermal treatment is conducted to complete the MOSFET.

Note that in the above manufacturing process, the gate oxide film is formed by oxidizing by n type semiconductor substrate 1 followed by the thermal treatment in the ammonia containing atmosphere at a temperature in the range from 600° C. to 900° C. in order to form oxynitride film 4B by nitriding the gate oxide film, but the gate oxide film may be thermally treated in an atmosphere of nitrogen monoxide about at 900° C. or alternatively thermally treated in an atmosphere of nitrogen dioxide at about at 1000° C. in order to nitride the gate oxide film to form oxynitride film 4B. Alternatively, n type semiconductor substrate 1 may directly be oxynitrided in an atmosphere of nitrogen monoxide about at 900° C. or in an atmosphere of nitrogen dioxide about at 1000° C. to form oxynitride film 4B.

The semiconductor device according to the second embodiment of the invention has a nitrogen containing region containing a larger amount of nitrogen in the vicinity of the lower edge portion of the gate electrode of the gate insulating film, in other words in the region implanted with hot carriers. As a result, a surface level is restrained from being generated between the gate insulating film in the vicinity of the lower edge portion of the gate electrode 5 implanted with hot carriers and the n type semiconductor substrate, while the carrier trap in the vicinity of the lower edge portion of the gate electrode in the gate insulating film may be reduced and therefore the deterioration of the MOSFET caused by hot carrier injection may be reduced.

In addition, the gate insulating film formed of the oxynitride film may increase the implantation charge amount until the gate insulating film breaks down, and therefore the dopant within the gate electrode may be restrained from being diffused into the silicon substrate. Further, the nitrogen containing region containing nitrogen in a higher concentration is formed only on both ends of the gate insulating film, the mobility of carriers may be restrained from being lowered by nitriding the gate electrode. As a result, a highly reliable MOSFET having high driving capability may be implemented.

Third Embodiment

Now, a semiconductor device according to a third embodiment of the invention and a manufacturing method thereof will be described in conjunction with figures.

Figure 15:
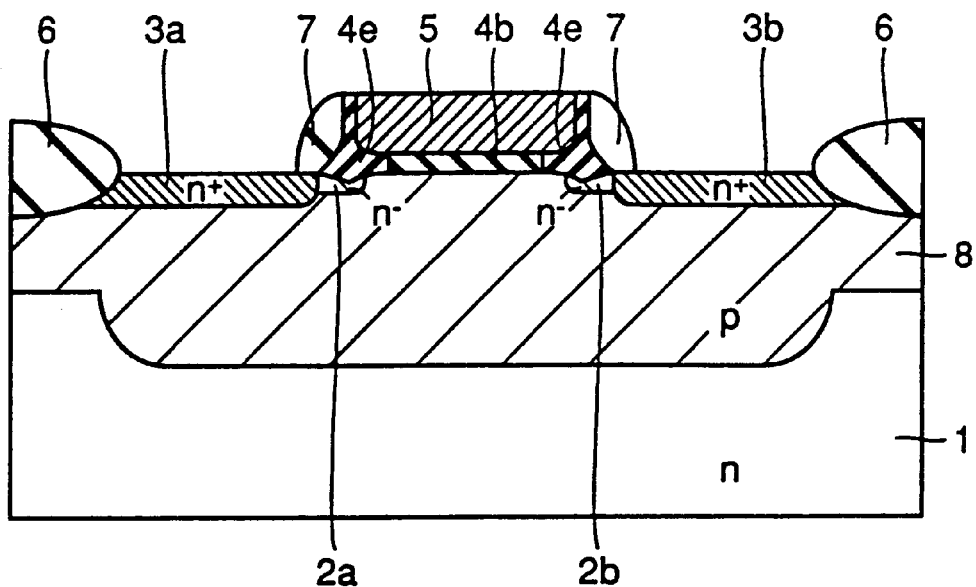
FIG. 15 is a cross section view showing the structure of a semiconductor device according to a third embodiment of the invention.

FIG. 15 is a cross sectional view schematically showing an MOSFET according to the third embodiment of the invention.

The structure of the MOSFET according to the third embodiment is the same as that of the MOSFET according to the second embodiment shown in FIG. 8 with an essential difference being that the nitrogen containing region 4d of the gate insulating film has a nitrogen containing region 4e having a larger thickness than low concentration nitrogen containing region 4d. The other structure is essentially the same as that of the MOSFET according to the second embodiment, and the same or corresponding portions are denoted with the same reference numerals and characters.

Referring to FIGS. 16 to 20, a method of manufacturing the MOSFET according to the third embodiment of the invention will be described.

Figure 16:
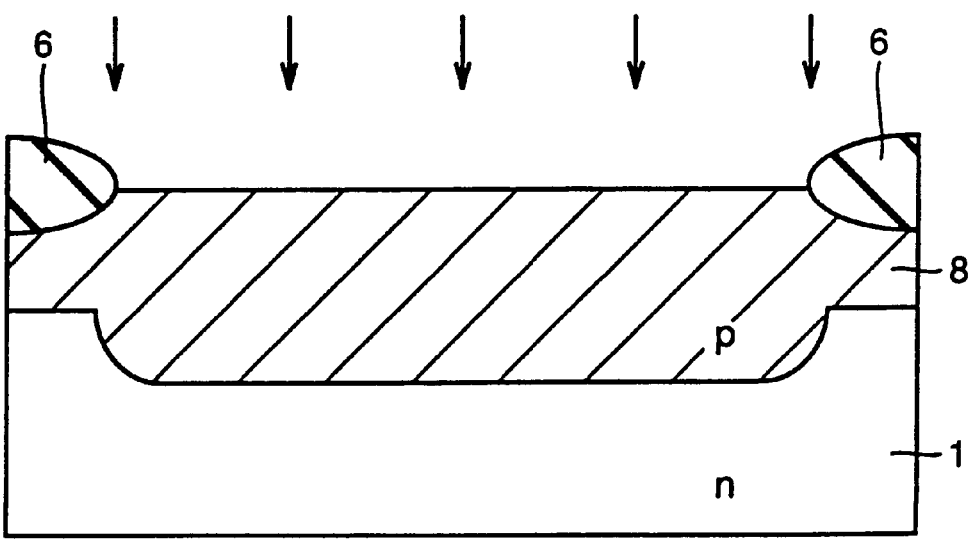
FIGS. 16 to 20 are cross sectional views showing first to fifth steps in a method of manufacturing the semiconductor device according to the third embodiment.

Referring to FIG. 16, an element isolation oxide film 6 is formed on n type semiconductor substrate 1 by selective oxidization, then boron ions are implanted in multiple stages with various implantation energies to form p well 8, while controlling the threshold voltage of the MOSFET.

Figure 17:
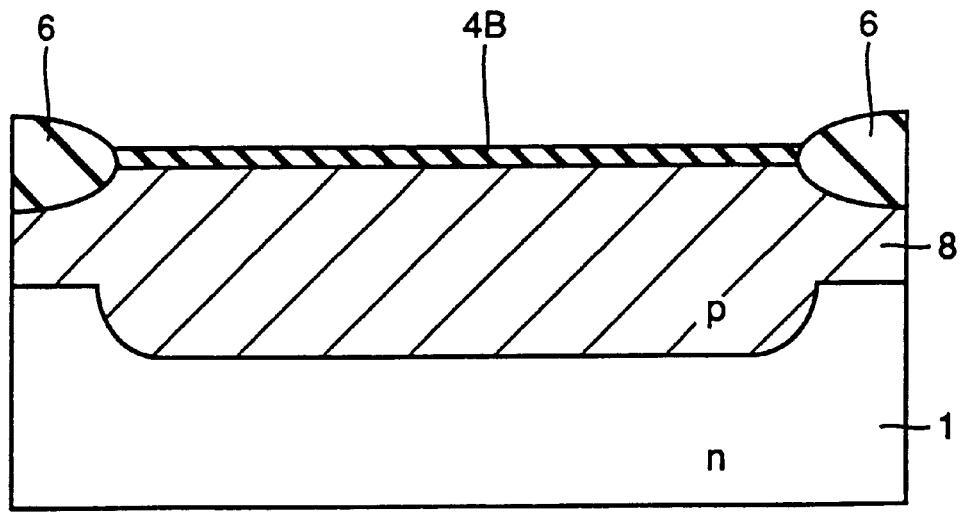

Now, referring to FIG. 17, a surface of n type semiconductor substrate 1 is thermally oxidized to form a gate oxide film, followed by thermal treatment in an ammonia atmosphere at a temperature in the range from 600° C. to 900° C. to form oxynitride film 4B.

Figure 18:
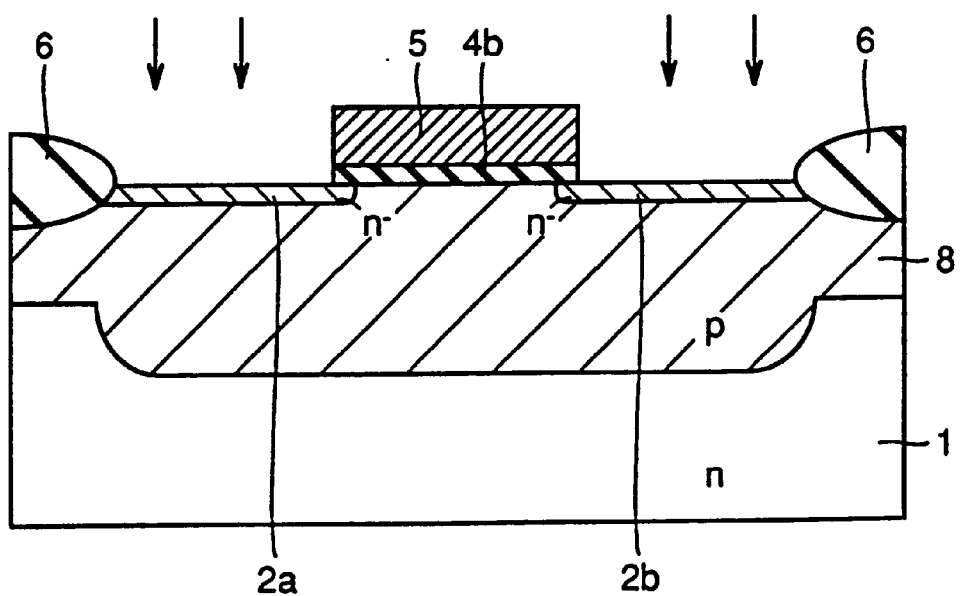

Then, referring to FIG. 18, a polycrystalline silicon film doped with phosphorus is formed on oxynitride film 4B, then a resist film having a prescribed shape is formed on the polycrystalline silicon film by means of photolithography.

Then, using the resist film as mask, the polycrystalline silicon film and oxynitride film 4B are etched, the resist film is removed away and gate electrode 5 and oxynitride film 4B are completed.

Figure 19:
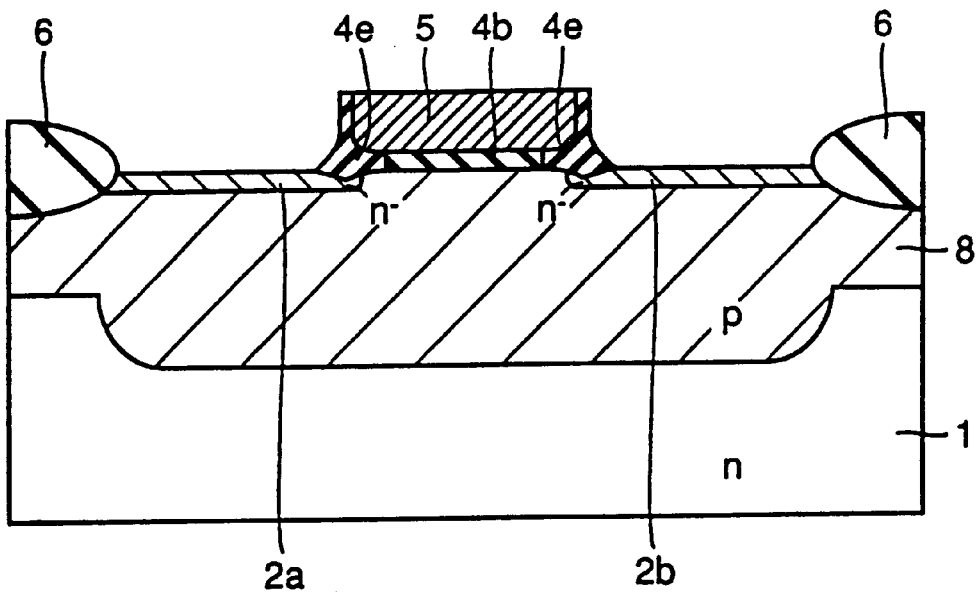

Now, referring to FIG. 19, oxynitride film 4b is thermally treated in an atmosphere containing nitrogen dioxide at about 1000° C. as well as nitriding oxynitride film 4b in the region in contact with the lower edge portion of gate electrode 5, and nitrogen containing region 4e having a region nitrided in a higher concentration in the vicinity of the lower edge portion of gate electrode 5 is formed. At the time, oxygen in nitrogen dioxide also oxidizes part of gate electrode 5 and part of n type semiconductor substrate 1, and nitrogen containing region 4e will have a thickness larger than low concentration nitrogen containing region 4b.

Using gate electrode 5 as mask, p well 8 is implanted with arsenic ions to form n⁻ type LDD layers 2a and 2b.

Figure 20:
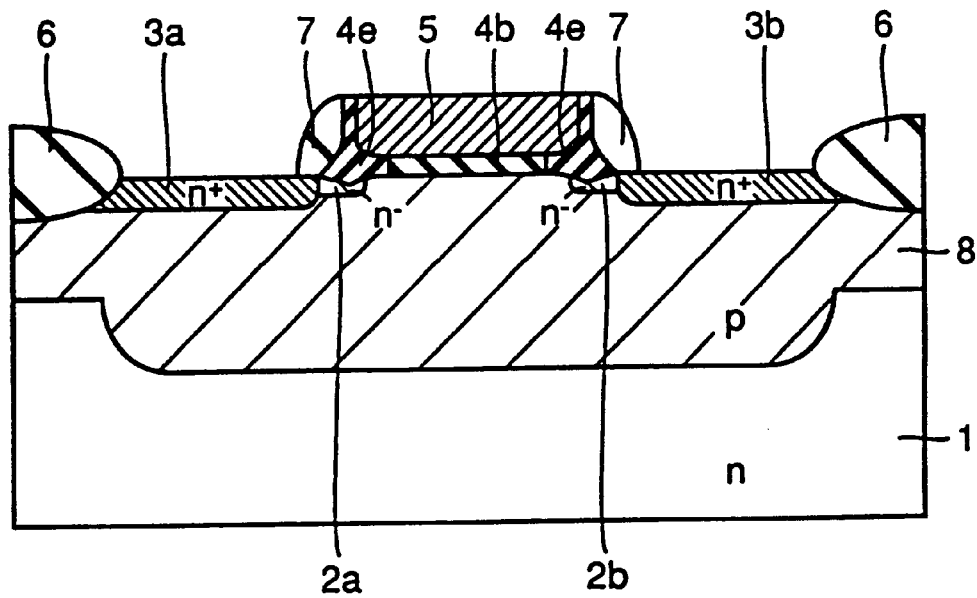

Now, referring to FIG. 20, sidewall oxide film 7 is formed on a sidewall of gate electrode 5, then using gate electrode 5 and sidewall oxide film 7 as mask, p well 8 is implanted with arsenic ions to form n⁺ type drain diffusion region 3a and n⁺ type source diffusion region 3b, followed by thermal treatment to complete the MOSFET.

In the foregoing description, nitrogen dioxide is used for oxynitriding the gate oxide film in the vicinity of the lower edge portion of the gate electrode, but it can be clearly seen that the same structure may be provided by thermal treatment in an atmosphere containing nitrogen monoxide at about 900° C. or in an atmosphere containing at least two kinds of gas among nitrogen monoxide, nitrogen dioxide and ammonia.

In the MOSFET according to the third embodiment, the nitrogen containing region containing a large amount of nitrogen is formed in the vicinity of the lower edge portion of the gate electrode of in the gate insulating film, in other words, in the region implanted with hot carriers. As a result, a surface level is restrained from being generated between the gate insulating film in the vicinity of the lower edge portion of the gate electrode implanted with hot carriers and the n type semiconductor substrate, while the carrier trap in the vicinity of the lower edge portion of the gate electrode in the gate insulating film may be reduced, and therefore the deterioration of the MOSFET by hot carrier injection may be reduced.

In addition, the gate insulating film is formed of an oxynitride film, the amount of charges injected until the gate insulating film breaks down may be increased, and the dopant in the gate electrode may be restrained from being diffused into the n type semiconductor substrate.

The nitrogen containing region containing nitrogen in a higher concentration is formed only on both ends of the gate insulating film, the lowering of the mobility of carriers may be restrained by nitriding the gate insulating film.

Furthermore, the gate oxide film at the lower edge portion of the gate electrode is oxidized by oxynitriding, and therefore oxygen is introduced, which may repair a damage given to the gate electrode caused by etching of the gate electrode. Therefore, a highly reliable MOSFET having high driving capability may be implemented.

Note that in the foregoing description, the gate oxide film is oxynitrided after forming the n⁻ type LDD layer, but the oxynitriding treatment may be conducted before forming the n⁻ type LDD layer, and the diffusion of n⁻ type LDD layer caused by the thermal treatment in the oxynitriding treatment may be restrained.

Fourth Embodiment

Now, an MOSFET according to a fourth embodiment of the present invention and a manufacturing method thereof will be described in conjunction with figures.

Figure 21:
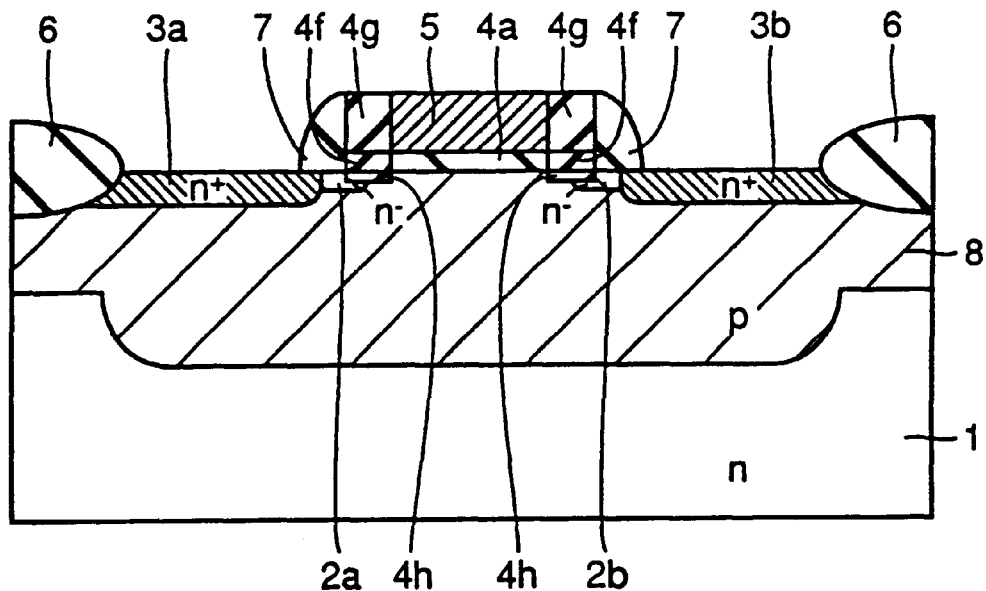
FIG. 21 is a cross sectional view showing the structure of a semiconductor device according to a fourth embodiment of the invention.

FIG. 21 is a cross sectional view schematically showing the MOSFET according to the fourth embodiment of the invention.

The structure of the fourth embodiment is substantially the same as that of the first embodiment shown in FIG. 1 with an essential difference being that the nitrogen containing regions 4f are formed on both ends of gate insulating film 4a and a nitrogen impurity layer 4h is formed to extend from nitrogen containing region 4f toward each of n⁻ type LDD layers 2a and 2b. The other structure is the same as that of the MOSFET according to the first embodiment, and therefore the same portions are denoted with the same reference numerals and characters.

Referring to FIGS. 22 to 26, a method of manufacturing the MOSFET according to the fourth embodiment of the invention will be described.

Figure 22:
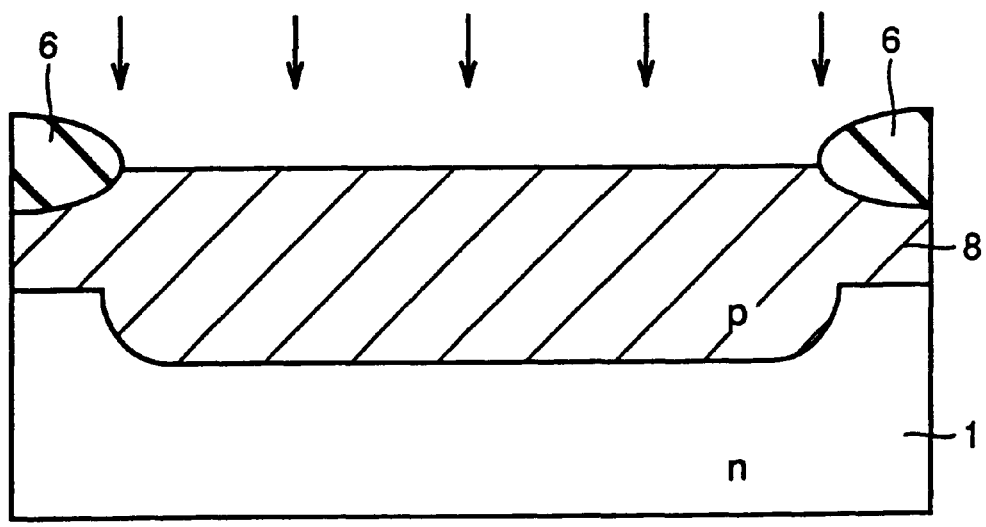
FIGS. 22 to 26 are cross sectional views showing first to fifth steps in a method of manufacturing the semiconductor device according to the fourth embodiment.

Referring to FIG. 22, an element isolation oxide film 6 is formed on n type semiconductor substrate 1 by selective oxidation, and then boron ions are implanted in multiple stages with various implantation energies to form a p well 8 while controlling the threshold voltage of the MOSFET.

Figure 23:
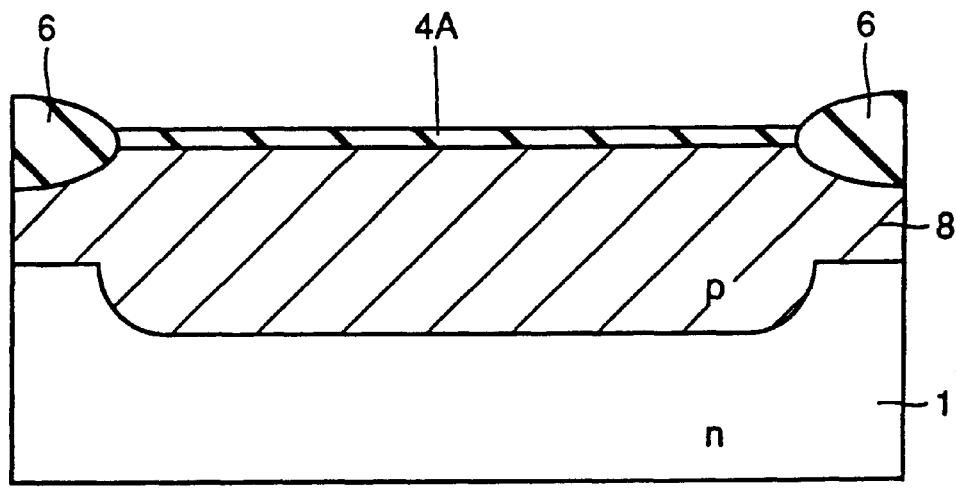

Now referring to FIG. 23, a surface of n type semiconductor substrate 1 is thermally oxidized to form a gate oxide film 4A.

Figure 24:
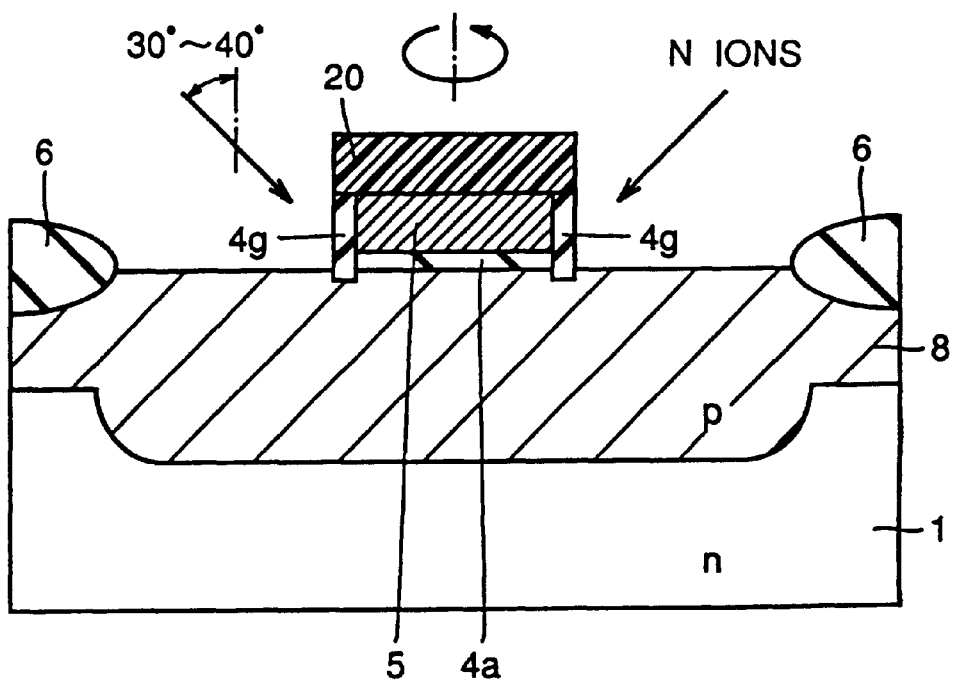

Referring to FIG. 24, a polycrystalline silicon film doped with phosphorus is formed on gate oxide film 4A, and then a resist film 20 patterned into a prescribed shape by means of photolithography is formed.

Using resist film 20 as mask, the polycrystalline silicon film and gate oxide film 4A are etched to complete a gate electrode 5 and gate oxide film 4a.

Then, while resist film 20 still remains, nitrogen ions are implanted from the position inclined at an angle in the range from 30° to 45° with respect to the perpendicular on the surface of n type semiconductor substrate 1, while turning n type semiconductor substrate 1. Nitrogen is thus introduced to the sidewalls of gate electrode 5, the sidewalls of gate insulating film 4a, and in the vicinity of the lower edge of gate electrode 5 in n type semiconductor substrate 1, and a nitrogen introduced region 4g is formed as a result. The amount of implanted nitrogen ions at the time is in the range from $1 \times 10^{15}$ to $1 \times 10^{16}$ cm$^{-2}$, with an implantation energy in the range from 5 to 20 KeV, the impurity concentration of nitrogen introduced region 4g falls about within the range from $1 \times 10^{20}$ cm$^{-3}$ to $1 \times 10^{21}$ cm$^{-3}$, and nitrogen introduced region 4g is formed to a thickness about in the range from 50 Å to 200 Å from the surface of n type semiconductor substrate 1.

Figure 25:
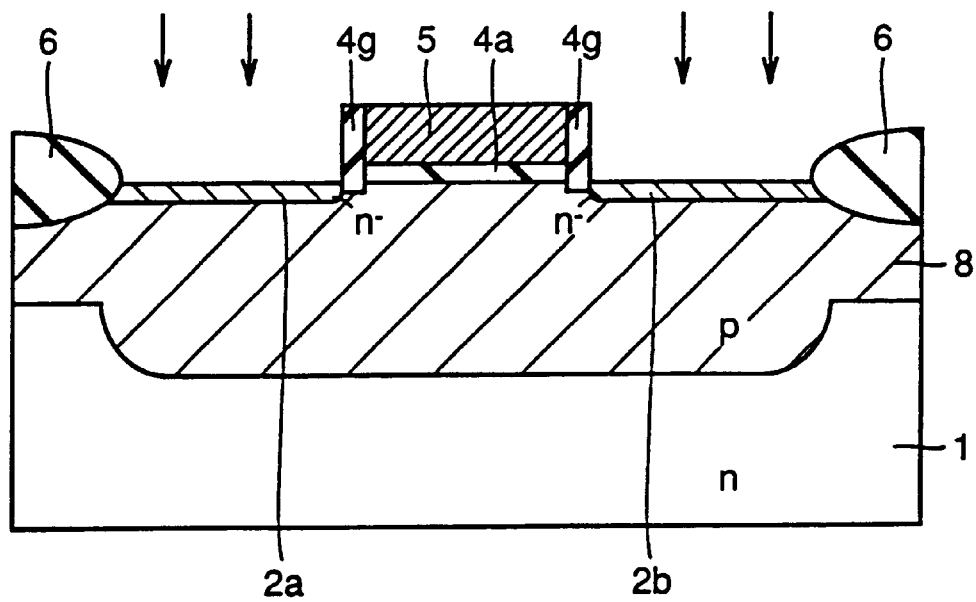

Then, referring to FIG. 25, after removal of resist film 20, using gate electrode 5 as mask, p well 8 is implanted with arsenic ions to form n$^-$ type LDD layers 2a and 2b.

Figure 26:
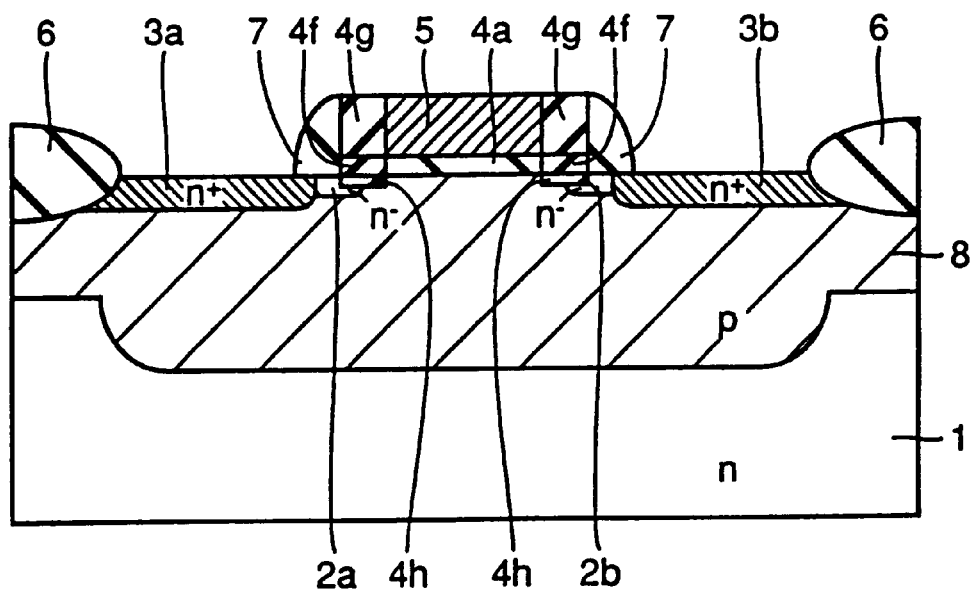

Now, referring to FIG. 26, a sidewall oxide film 7 is formed on a sidewall of gate electrode 5, and using gate electrode 5 and sidewall oxide film 7 as mask, p well 8 is implanted with arsenic ions to form an n$^+$ type drain diffusion region 3a and an n$^+$ type source diffusion region 3b.

Then thermal treatment is conducted to complete the MOSFET. The nitrogen implanted into the sidewall of gate electrode 5 and n type semiconductor substrate 1 precipitate at both ends of gate insulating film 4a by the thermal treatment, and nitrogen containing regions 4f are formed on both ends of gate insulating film 4a.

In the MOSFET according to the fourth embodiment, the nitrogen containing region is formed only in the vicinity of the lower edge portion of the gate electrode, in other words only in the region implanted with hot carriers. As a result, a surface level is restrained from being generated between the gate insulating film in the vicinity of the edge portion of the gate electrode implanted with hot carriers and n type semiconductor substrate, carrier trap in the vicinity of the lower edge portion of the gate electrode in the gate insulating film may be reduced, and therefore the deterioration of the MOSFET by the injection of hot carriers may be reduced.

Further, the nitrogen containing region is formed only on both ends of the gate insulating film, and therefore decrease in the mobility of carriers by nitriding the gate insulating film may be restrained. The gate insulating film is nitrided by ion implantation and thermal treatment for activating the source/drain diffusion regions, and therefore a simple process with only one additional step of ion implantation may be employed to implement the structure of the MOSFET according to this embodiment. As a result, a highly reliable MOSFET with high driving capability may be readily be implemented.

Fifth Embodiment

Now, a semiconductor device according to a fifth embodiment of the invention and a manufacturing method thereof will be described in conjunction with figures.

Figure 27:
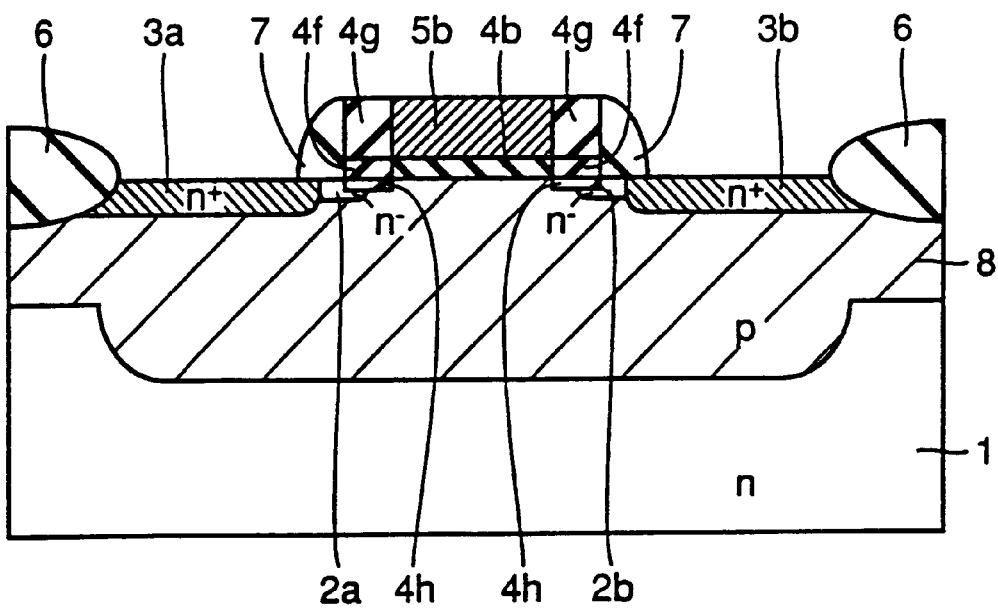
FIG. 27 is a cross sectional view showing the structure of a semiconductor device according to a fifth embodiment of the invention.

FIG. 27 is a cross sectional view schematically showing an MOSFET according to the fifth embodiment of the invention.

The structure of the MOSFET according to the fifth embodiment is substantially the same as that of the fourth embodiment shown in FIG. 21 with an essential difference being that the MOSFET according to the fifth embodiment is provided with a low concentration nitrogen containing region 4b having a lower nitrogen impurity concentration than nitrogen containing region 4f also in the region between nitrogen containing regions 4f in the gate insulating film, and that gate electrode 5b also contains nitrogen.

Since the other structure is the same as that of the MOSFET according to the fourth embodiment, the same or corresponding portions are denoted with the same reference numerals and characters.

A method of manufacturing the MOSFET according to the fifth embodiment will be described in conjunction with FIGS. 28 to 32.

Figure 28:
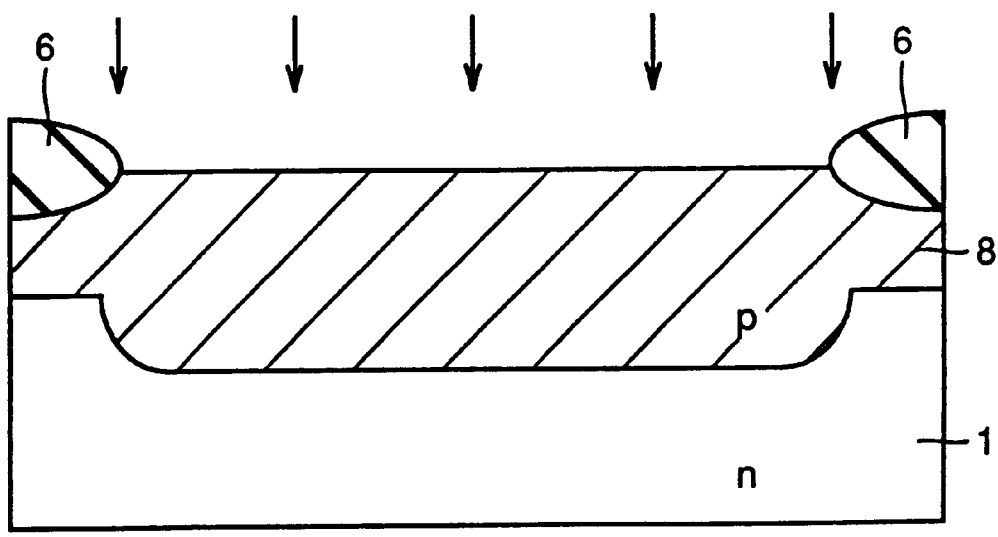
FIGS. 28 to 32 are cross sectional views showing first to fifth steps in a method of manufacturing the semiconductor device according to the fifth embodiment.

Referring to FIG. 28, an element isolation oxide film 6 is formed on n type semiconductor substrate 1 by selective oxidation, and then boron ions are implanted in multiple stages with various energies to form a p well 8 while controlling the threshold of the MOSFET.

Figure 29:
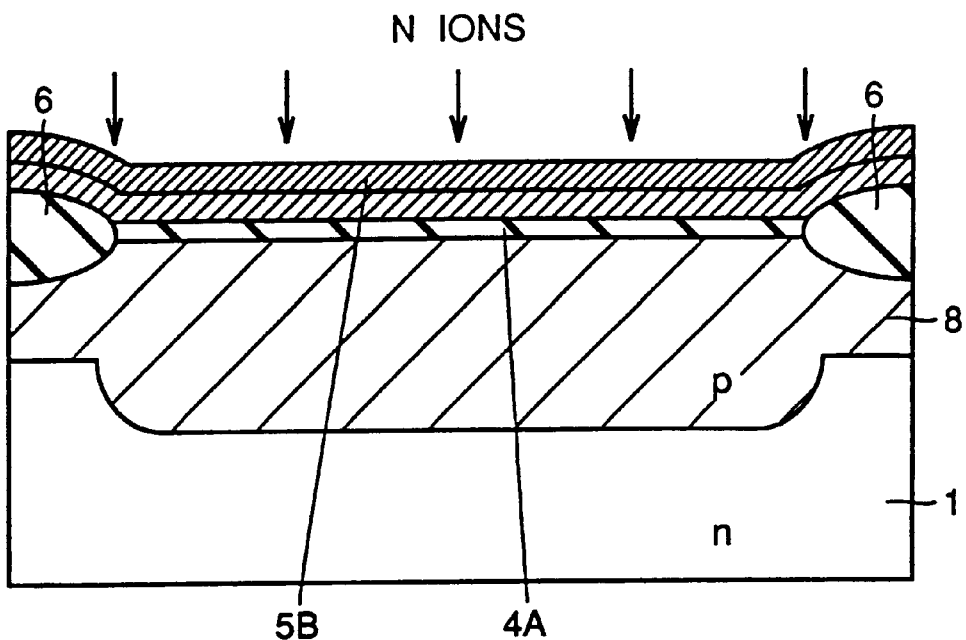

Now, referring to FIG. 29, a surface of n type semiconductor substrate 1 is thermally oxidized to form a gate oxide film, and then a polycrystalline silicon film doped with phosphorus is formed. Then, an upper layer portion of the polycrystalline silicon film is implanted with nitrogen ions to complete a polycrystalline silicon layer 5B containing nitrogen in its upper layer portion.

Figure 30:
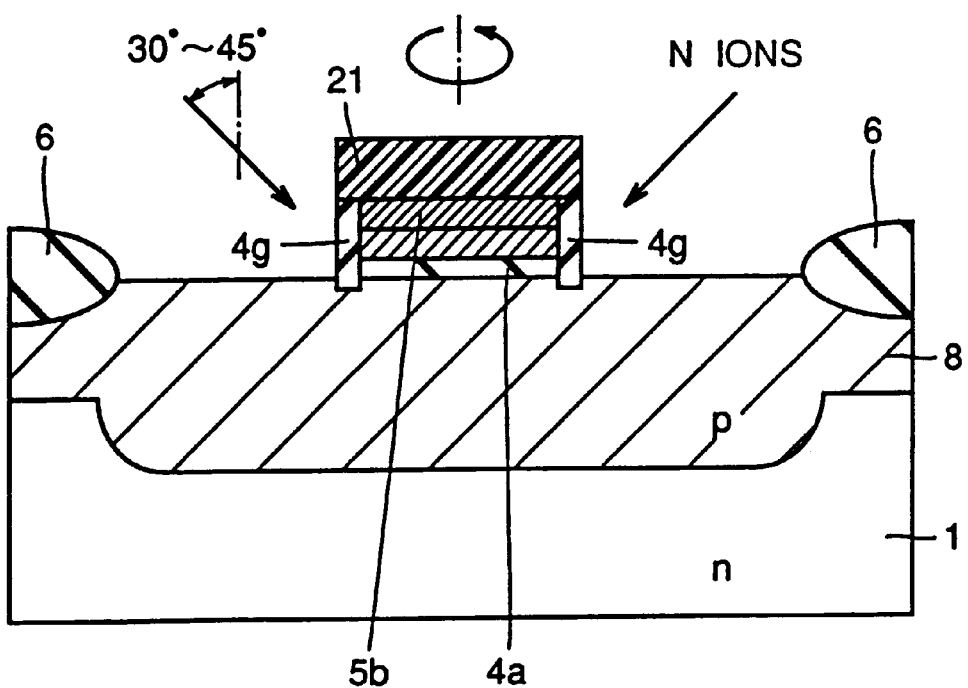

Now, referring to FIG. 30, a resist film 21 patterned into a prescribed shape by means of photolithography is formed on polycrystalline silicon film 5B, and using resist film 21 as mask, polycrystalline silicon film 5B and gate oxide film 4A are patterned to complete a gate electrode 5b and a gate electrode 4a.

Then, while resist film 21 still remains, nitrogen ions are implanted from the position inclined at an angle in the range from 35° C. to 45° C. with respect to the perpendicular on n type semiconductor substrate 1 while turning n type semiconductor substrate 1, so that nitrogen is introduced into the sidewall portion of gate electrode 5b and in n type semiconductor substrate 1 in the vicinity of the lower edge portion of gate electrode 5b to form a nitrogen introduced region 4g.

Figure 31:
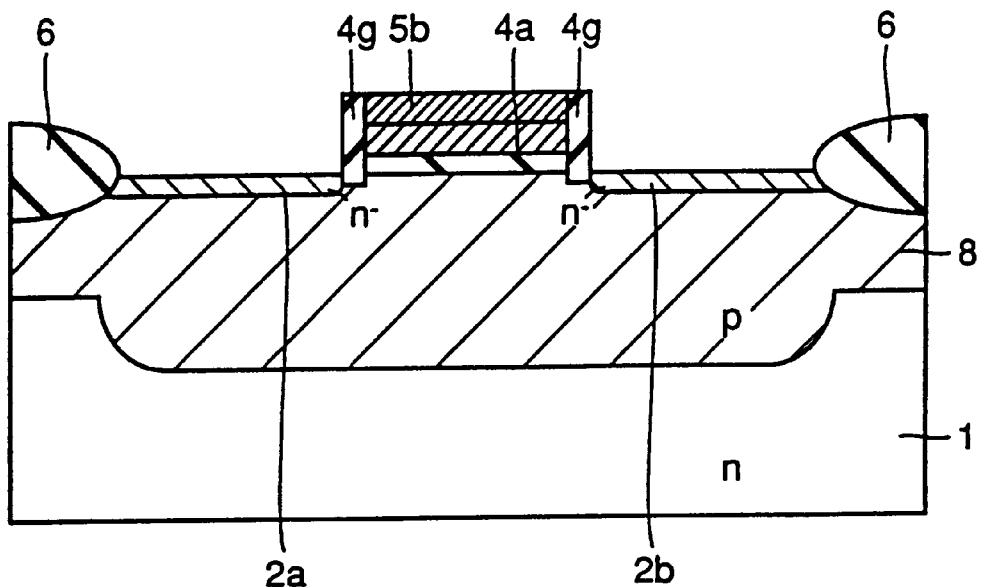

Referring to FIG. 31, using gate electrode 5b as mask, p well 8 is implanted with arsenic ions to form n$^-$ type LDD layers 2a and 2b.

Figure 32:
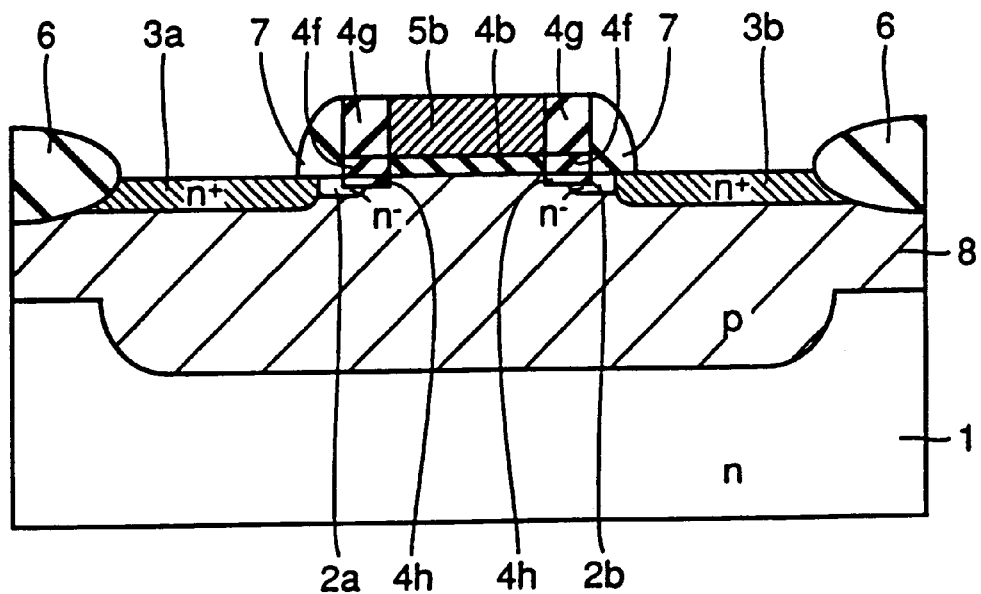

Referring to FIG. 32, after a sidewall oxide film 7 is formed on sidewalls of gate electrode 5b, using gate electrode 5b and sidewall oxide film 7 as mask, p well 8 is implanted with arsenic ions to form an n$^+$ type drain diffusion region 3a and an n$^+$ type source diffusion region 3b, and then thermal treatment is conducted to complete the NMOS transistor FET according to the fifth embodiment of the invention.

The thermal treatment permits the nitrogen in gate electrode 5b and n type semiconductor substrate 1 to precipitate at gate oxide film 4a and a low concentration nitrogen containing region 4b having a lower nitrogen concentration than nitrogen containing region 4f is formed in a region between nitrogen containing regions 4f.

In the MOSFET according to the fifth embodiment, there is formed a nitrogen containing region containing a large amount of nitrogen in the region in the vicinity of the lower edge of the gate electrode, in other words in the region injected with hot carriers. As a result, a surface level is restrained from being generated between the gate insulating film in the vicinity of the lower edge portion of the gate electrode injected with hot carriers and the n type semiconductor substrate, while carrier trap in the vicinity of the lower edge portion of the gate electrode in the gate insulating film may be reduced, and therefore the deterioration of the MOSFET by the hot carrier injection may effectively be reduced.

Further, since the gate insulating film is an oxynitride film, the amount of charge injected until the gate insulating film breaks down may be increased, and therefore the diffusion of dopant in the gate electrode into the n type semiconductor substrate may be restrained.

Further, the nitrogen containing regions containing nitrogen in a higher concentration are formed only on both ends of the gate insulating film, decrease in the mobility of carriers by nitriding the gate insulating film may be restrained.

The gate insulating film is nitrided by the simple process with only two additional steps of ion implantation, a higher reliable MOSFET with high driving capability may readily be implemented.

Sixth Embodiment

A semiconductor device according to a sixth embodiment of the invention and a manufacturing method thereof will be described in conjunction with figures.

Figure 33:
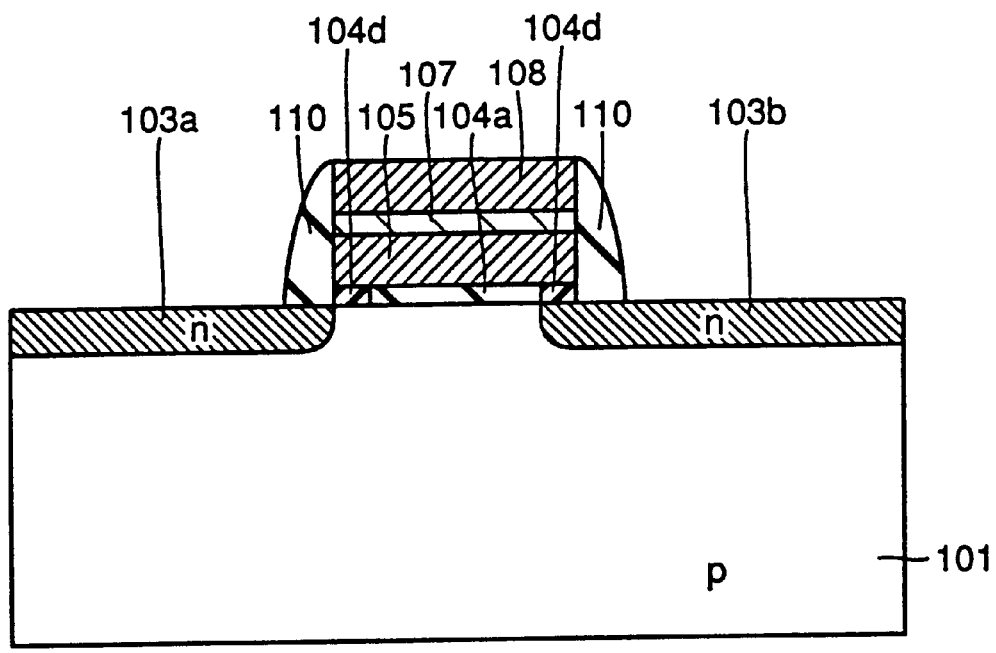
FIG. 33 is a cross sectional view showing the structure of a semiconductor device according to a sixth embodiment of the invention.

FIG. 33 is a cross sectional view schematically showing a flash EEPROM according to the sixth embodiment of the invention. On a p type semiconductor substrate 101 formed such as of a silicon substrate, an n type drain diffusion region 103a and an n type source diffusion region 103b are formed a prescribed space apart from each other with a channel region therebetween. On the channel region, a charge accumulating electrode 105 is formed with a gate insulating film 104a therebetween. Gate insulating film 104a in contact with a lower edge portion of charge accumulating electrode 105 has a nitrogen containing region 104d.

A control electrode 108 is formed on charge accumulating electrode 105 with an interlayer insulating film 107 therebetween for electrical isolation from charge accumulating electrode 105. On sidewalls of charge accumulating electrode 105 and control electrode 108, a sidewall oxide film 110 is formed.

Figure 34:
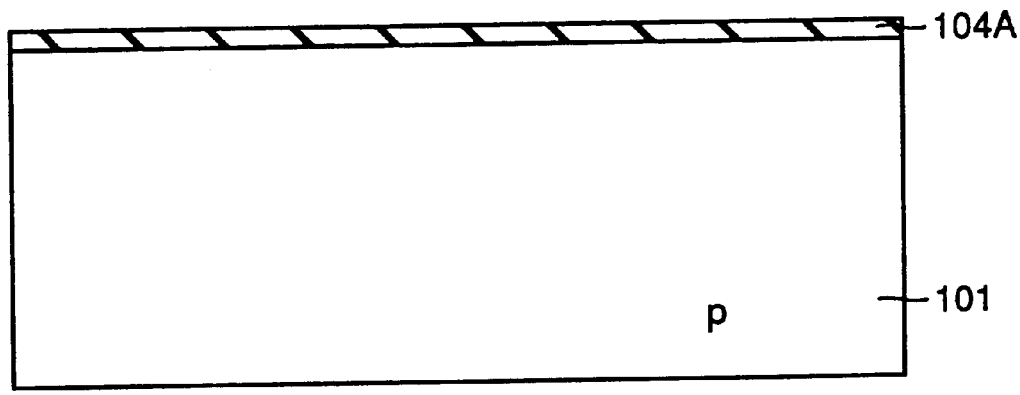
FIGS. 34 to 39 are cross sectional views showing first to sixth steps in a method of manufacturing the semiconductor device according to the sixth embodiment.

Referring to FIGS. 34 to 39, a method of manufacturing the flash EEPROM according to the sixth embodiment of the invention will be described. Referring to FIG. 34, a gate oxide film 104A is formed on p type semiconductor substrate 101 by thermally oxidizing p type semiconductor substrate 101.

Figure 35:
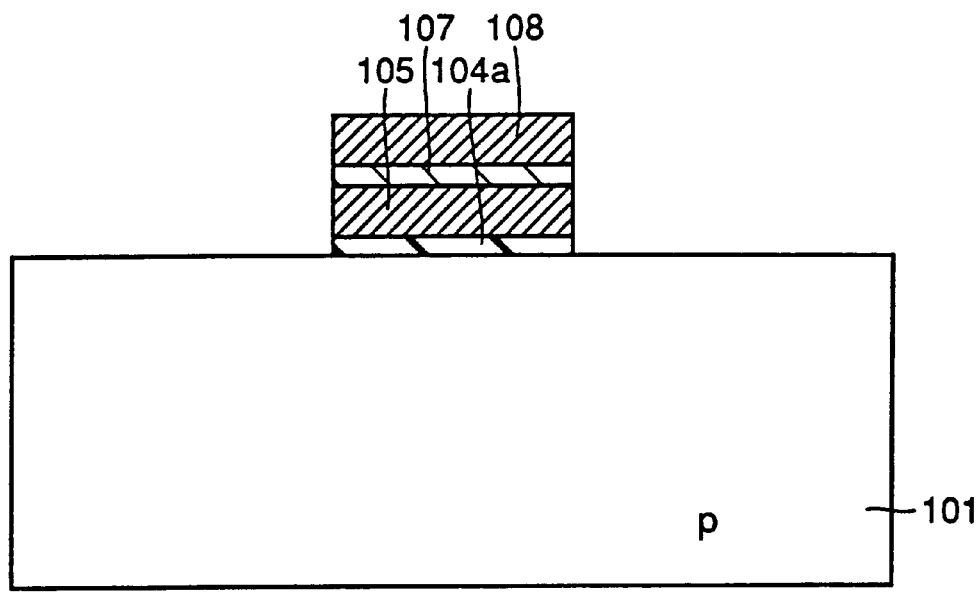

Now, referring to FIG. 35, a first polycrystalline silicon film doped with phosphorus is formed, on which an interlayer insulating film formed of a composite film of an oxide film and a nitride film is formed, and then a second polycrystalline silicon film is formed on the interlayer insulating film.

Then, a resist film patterned into a prescribed shape by means of photolithography is formed on the second polycrystalline silicon film using the resist film as mask, gate oxide film 104A, the first polycrystalline silicon film, the interlayer insulating film and the second polycrystalline silicon film are patterned to complete gate insulating film 104a, charge accumulating electrode 105, interlayer insulating film 107 and control electrode 108.

Figure 36:
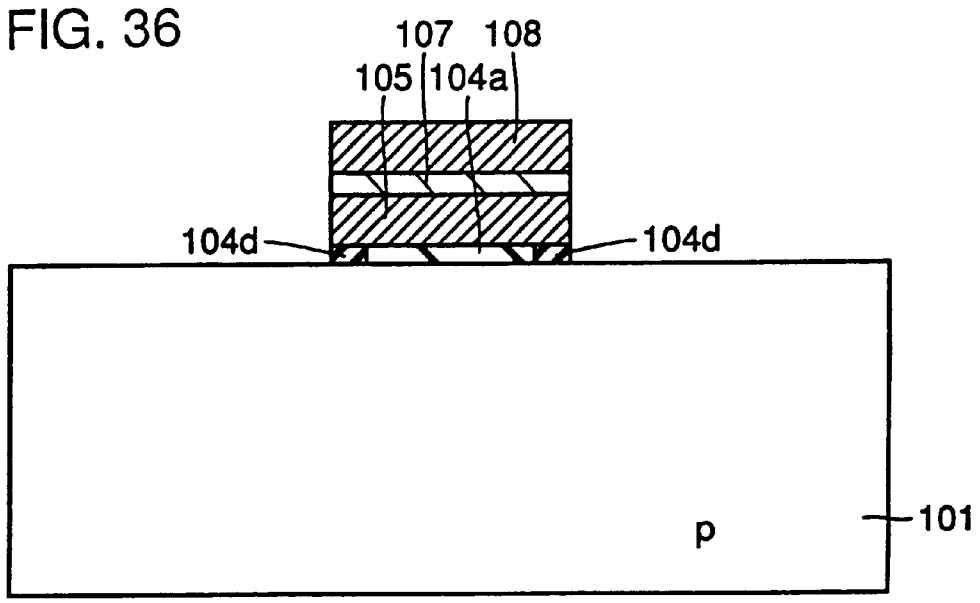

Referring to FIG. 36, thermal treatment at a temperature of about 800° C. is conducted in an atmosphere containing ammonia, gate insulating film 104a in a region in contact with the lower edge portion of charge accumulating electrode 105 is nitrided to form nitrogen containing regions 104d on both ends of gate insulating film 104a.

Figure 37:
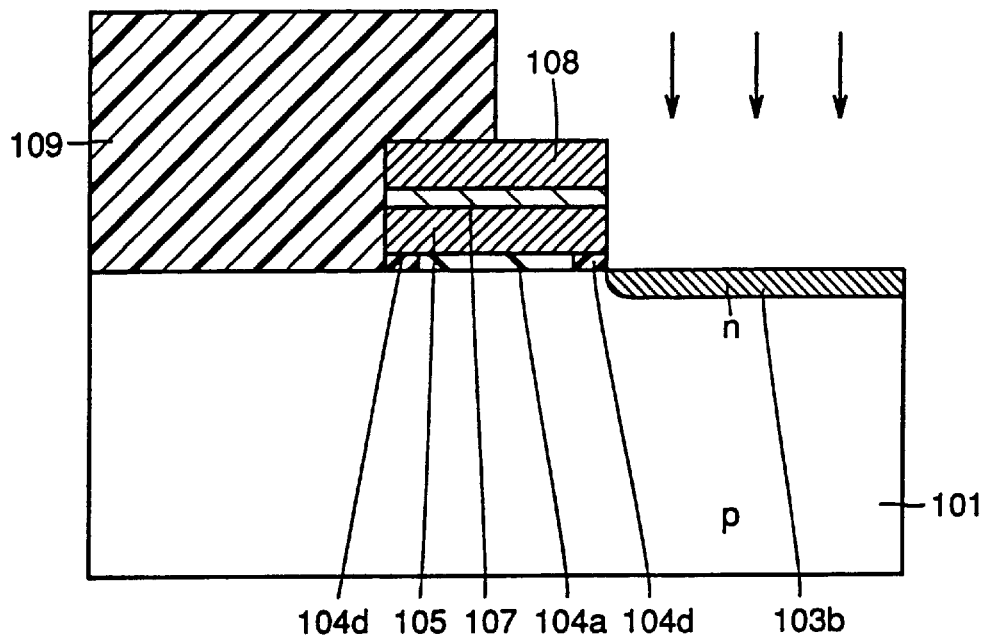

Referring to FIG. 37, a resist film 109 is formed so as to cover a region to be the drain diffusion region of the flash EEPROM, and using resist film 109 and control electrode 108 as mask p type semiconductor substrate 101 is implanted with arsenic ions to form a source diffusion region 103b.

Figure 38:
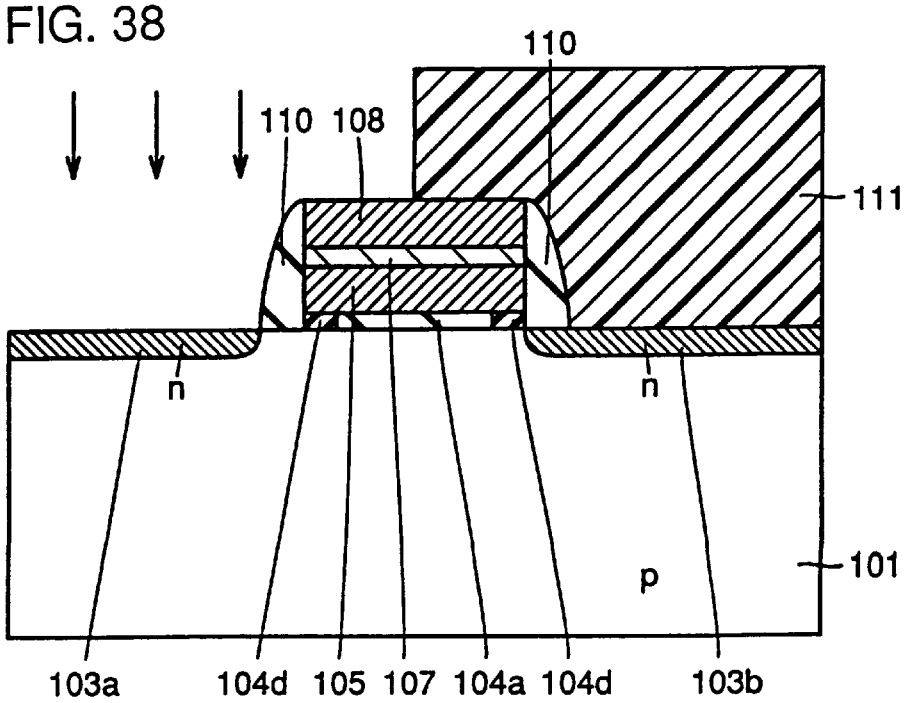
Figure 39:
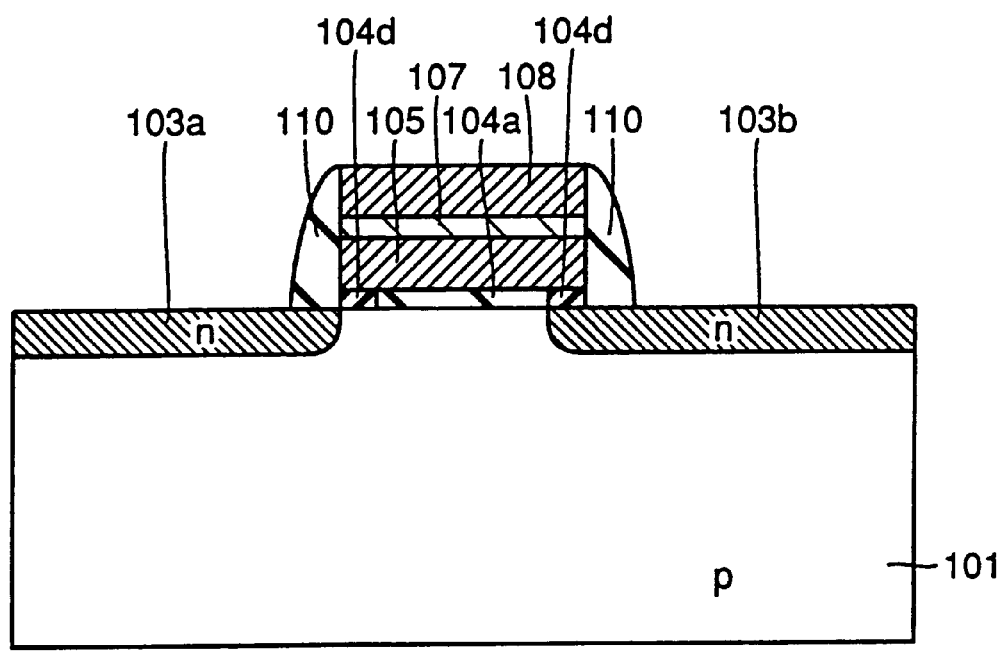

Referring to FIG. 38, after removal of resist film 109, a sidewall oxide film 110 is formed on sidewalls of charge accumulating electrode 105 and control electrode 108, and then a resist film 111 is formed covering n type source diffusion region 103b.

Then, using control electrode 108 and resist film 111 as mask, p type semiconductor substrate 101 is implanted with arsenic ions to form an n type drain region 103a. Then, referring to FIG. 39, after removal of resist film 111 thermal treatment is conducted to complete the flash EEPROM according to the sixth embodiment of the invention.

In the flash EEPROM according to the sixth embodiment, the nitrogen containing region is formed only in the gate insulating film in the vicinity of the lower edge of the charge accumulating electrode, in other words only in the gate insulating film in the region through which electrons tunnel at the time of writing and erasure. As a result, a surface level is restrained from being generated between the gate insulating film at the edge portion of the charge accumulating electrode through which the electrons tunnel and the semiconductor substrate, while carrier trap in the vicinity of the lower edge portion of the charge accumulating electrode in the gate insulating film may be reduced, and therefore the deterioration of the flash EEPROM by writing and erasure may be reduced.

Further, the nitrogen containing regions are formed only on both end portions of the gate insulating film, and therefore decrease in the mobility of carriers caused by nitriding the gate insulating film may be reduced. As a result, a highly reliable flash EEPROM with high driving capability may be provided.

Seventh Embodiment

A semiconductor device according to a seventh embodiment of the invention and a manufacturing method thereof will be described with figures.

Figure 40:
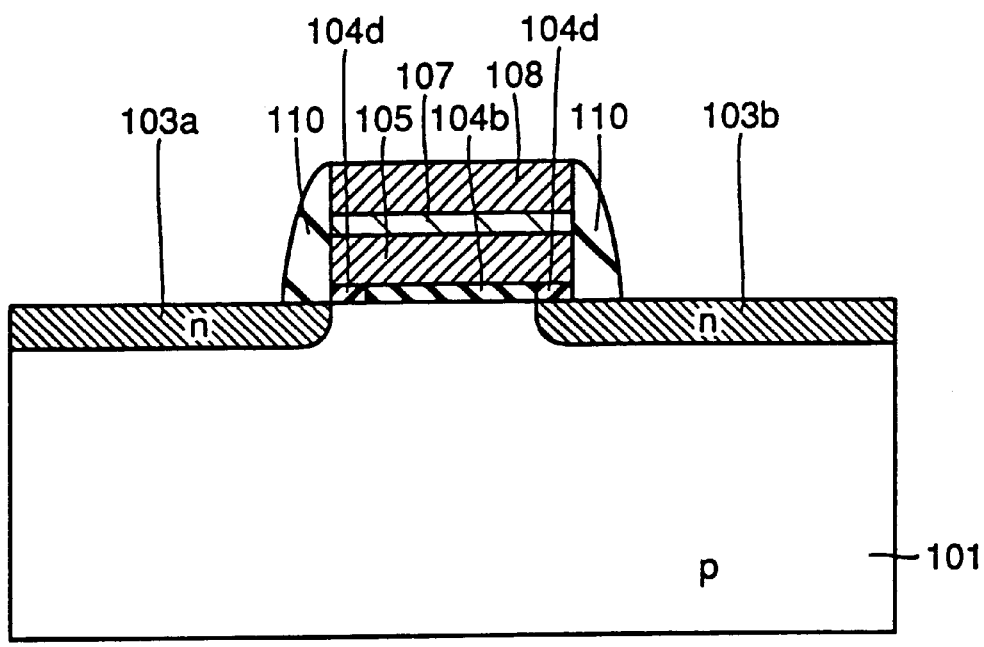
FIG. 40 is a cross sectional view showing the structure of a semiconductor device according to a seventh embodiment of the invention.

FIG. 40 is a cross sectional view schematically showing a flash EEPROM according to the seventh embodiment of the invention.

The structure of the flash EEPROM according to the seventh embodiment is substantially the same as that of the sixth embodiment shown in FIG. 33 with an essential difference being that a low concentration nitrogen containing region 4b which has a nitrogen impurity concentration lower than that of the nitrogen containing region 4d is provided also in the region between nitrogen containing regions 104d in the gate insulating film. The other structure is the same as that of the flash EEPROM according to the sixth embodiment of the invention, and therefore the same portions as the flash EEPROM shown in FIG. 33 are denoted with the same reference numerals and characters.

Referring to FIGS. 41 to 46, a method of manufacturing the flash EEPROM according to the seventh embodiment will be described.

Figure 41:
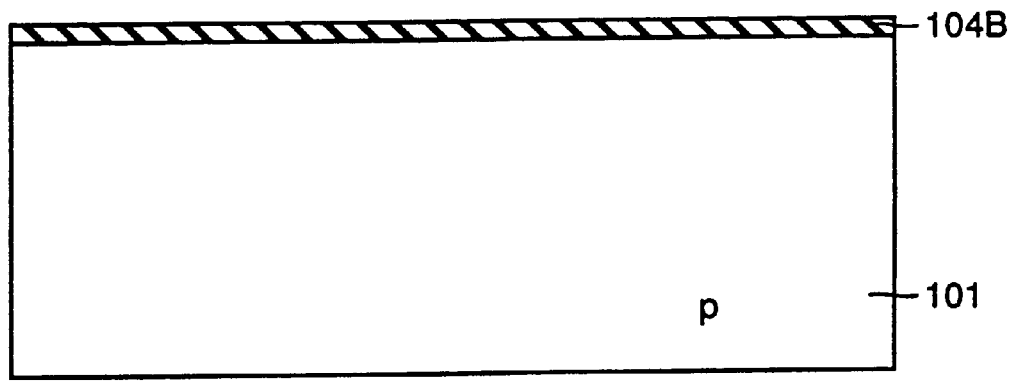
FIGS. 41 to 46 are cross sectional views showing first to sixth steps in a method of manufacturing the semiconductor device according to the seventh embodiment.

Referring to FIG. 41, a gate oxide film is formed on a surface of a p type semiconductor substrate 101 by means of thermal oxidation, and a thermal treatment at a temperature in the range from 600° C. to 900° C. in an ammonia atmosphere follows to nitride the gate oxide film to form an oxynitride film 104B.

Figure 42:
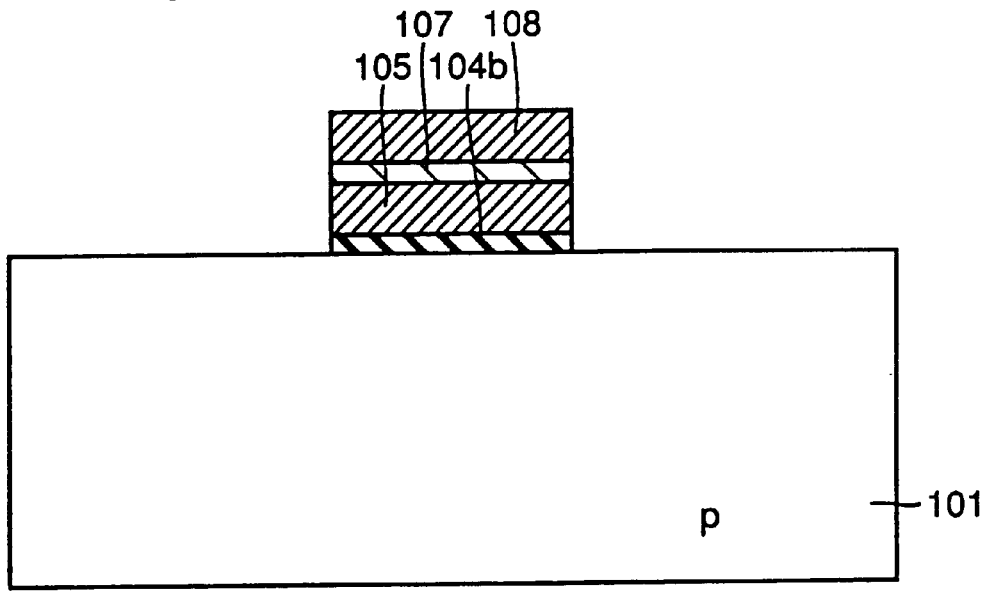

Referring to FIG. 42, on oxynitride film 104B, a first polycrystalline silicon film doped with phosphorus is formed, on which an interlayer insulating film formed of a composite film of an oxide film and a nitride film is formed. Then, a second polycrystalline silicon film doped with phosphorus is formed on the interlayer insulating film.

Then, a resist film patterned into a prescribed shape by means of photolithography is formed on the second polycrystalline silicon film, then using the resist film as mask, the gate insulating film, the first polycrystalline silicon film, the interlayer insulating film, and the second polycrystalline silicon film are etched, and the resist film is removed to complete a gate insulating film 104b, a charge accumulating electrode 105, an interlayer insulating film 107, and a control electrode 108.

Figure 43:
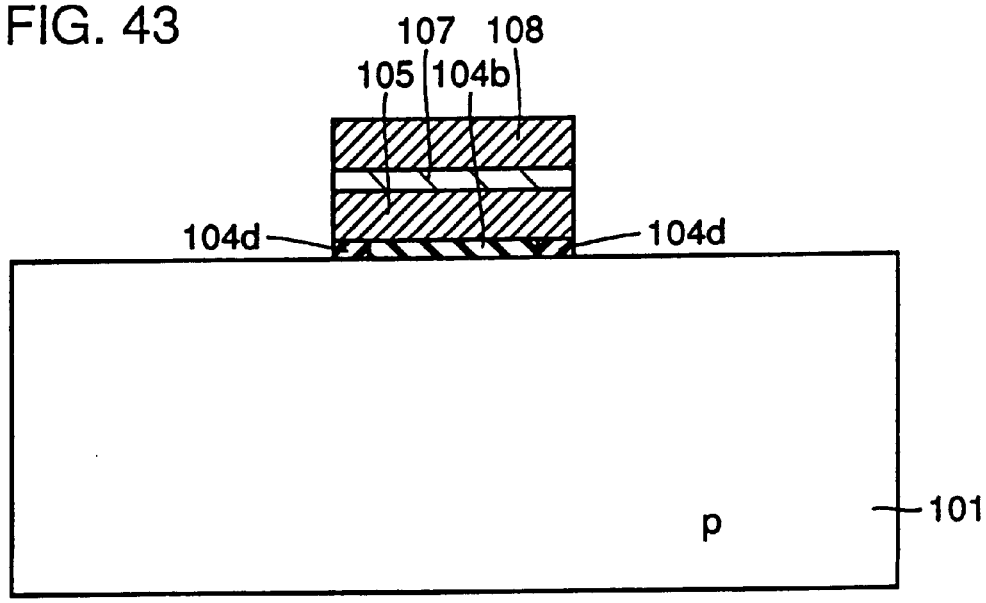

Referring to FIG. 43, a thermal treatment at a temperature in the range from 600° C. to 900° C. in an atmosphere containing ammonia is conducted to nitride gate electrode 104b in the region in contact with an edge portion of charge accumulating electrode 105, and a nitrogen containing region 104d having a high nitrogen concentration is formed.

Figure 44:
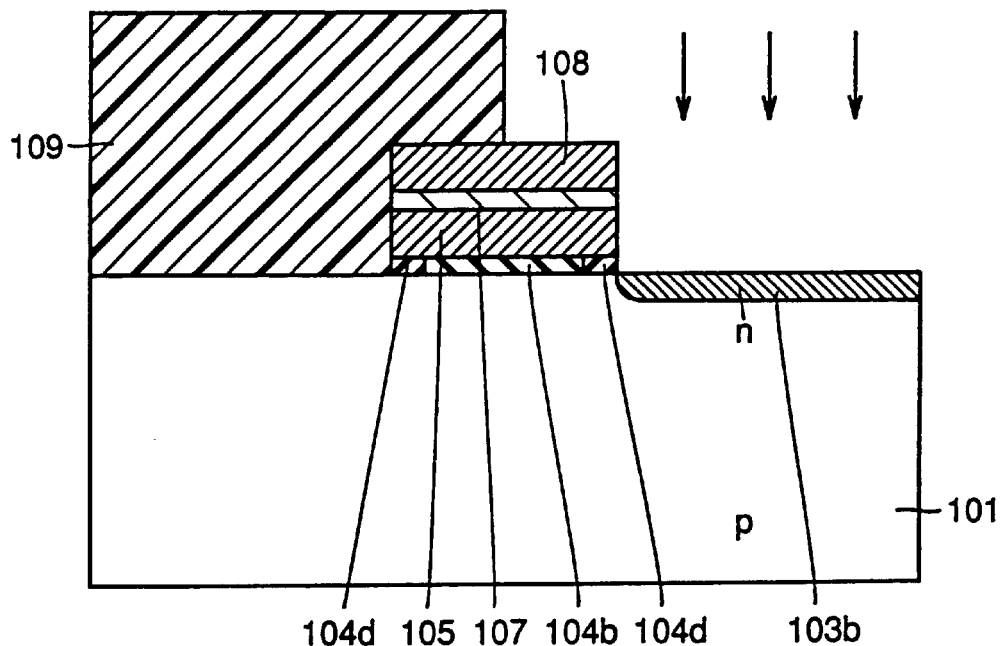

Referring to FIG. 44, a resist film 109 is formed to cover a region to be the n type drain diffusion region of the flash EEPROM, and using control electrode 108 and resist film 109 as mask, p type semiconductor substrate 101 is implanted with arsenic ions to form an n type source diffusion region 103b.

Figure 45:
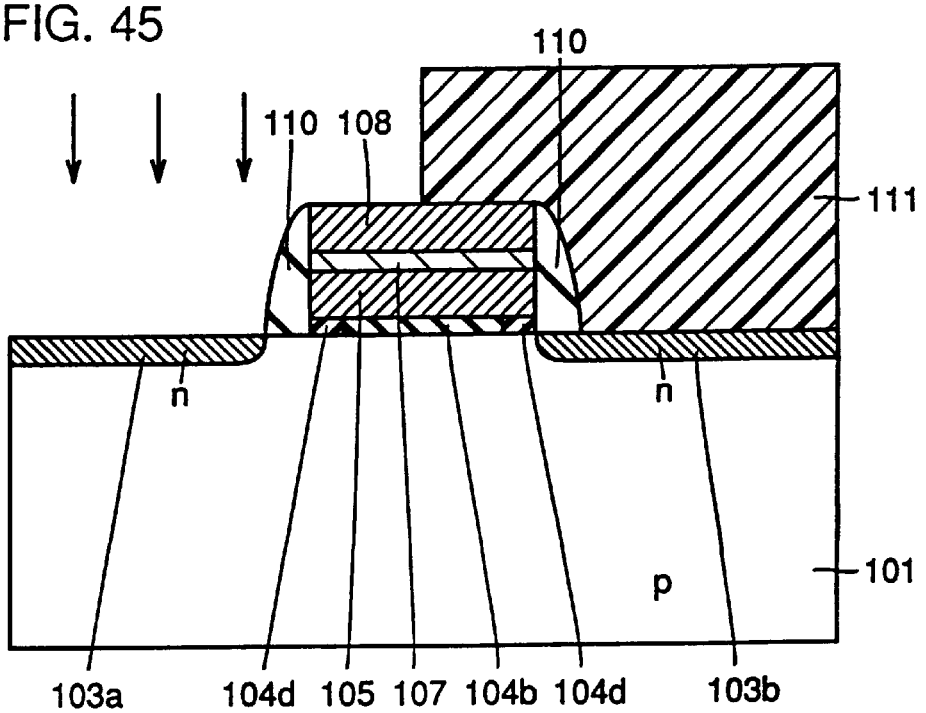
Figure 46:
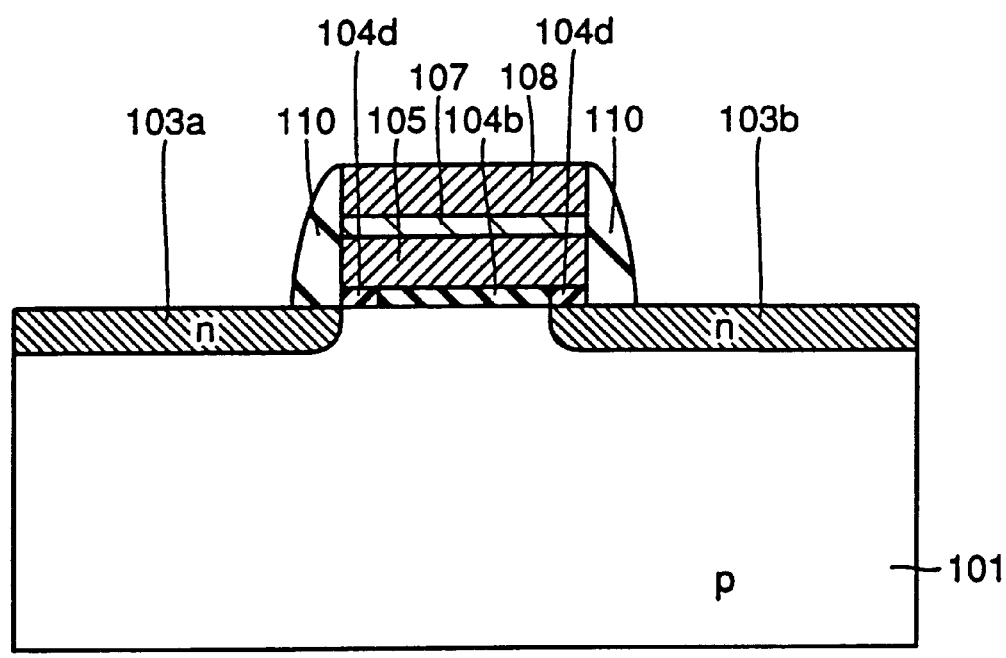

Referring to FIG. 45, resist film 109 is removed, a sidewall oxide film 110 is formed on sidewalls of charge accumulating electrode 105 and control electrode 108, then a resist film 111 covering n type source diffusion region 103b is formed, and using control electrode 108 and resist film 111 as mask, p type semiconductor substrate 101 is implanted with arsenic ions to form an n type drain diffusion region 103a. Then, as shown in FIG. 46, after removal of resist film 111, a thermal treatment is conducted to complete the flash EEPROM according to the seventh embodiment of the invention.

In the foregoing description, the gate oxide film is formed by oxidization of p type semiconductor substrate 101 and a thermal treatment at a temperature in the range from 600° C. to 900° C. in an atmosphere of ammonia is conducted to nitride the gate oxide film to form an oxynitride film, but the gate oxide film may be nitrided to form the oxynitride film by thermally treating the gate oxide film at about 900° C. in a nitrogen monoxide atmosphere or at about 1000° C. in a nitrogen dioxide atmosphere. Alternatively, p type semiconductor substrate 101 may be directly oxynitrided at 900° C. in a nitrogen monoxide atmosphere or at about 1000° C. in a nitrogen dioxide atmosphere to form oxynitride film 104.

In the semiconductor device according to the seventh embodiment of the invention, there is formed an oxynitride film containing a larger amount of nitrogen in the gate insulating film in the vicinity of the lower edge portion of the charge accumulating electrode, in other words the region through which electrons tunnel at the time of writing and erasure.

As a result, a surface level is restrained from being generated between the gate insulating film in the vicinity of the lower edge portion of charge accumulating electrode through which electrons tunnel and the p type semiconductor substrate, while carrier trap in the vicinity of the lower edge portion of the charge accumulating electrode in the gate insulating film may be reduced, and therefore the deterioration of the flash EEPROM by writing and erasure may be reduced. In addition, since the gate insulating film is an oxynitride film, the amount of charges to be injected until the gate insulating film breaks down may be increased, and therefore the diffusion of the dopant within the charge accumulating electrode into the semiconductor substrate may be restrained.

The nitrogen containing region containing nitrogen in a high concentration is formed only on both end portions of the gate insulating film, and therefore decrease in the mobility of carriers caused by nitriding the gate insulating film may be restrained. As a result, a highly reliable flash EEPROM with high driving capability may be provided.

Eighth Embodiment

Now, a semiconductor device according to an eighth embodiment of the invention and a manufacturing method thereof will be described in conjunction with associated figures.

Figure 47:
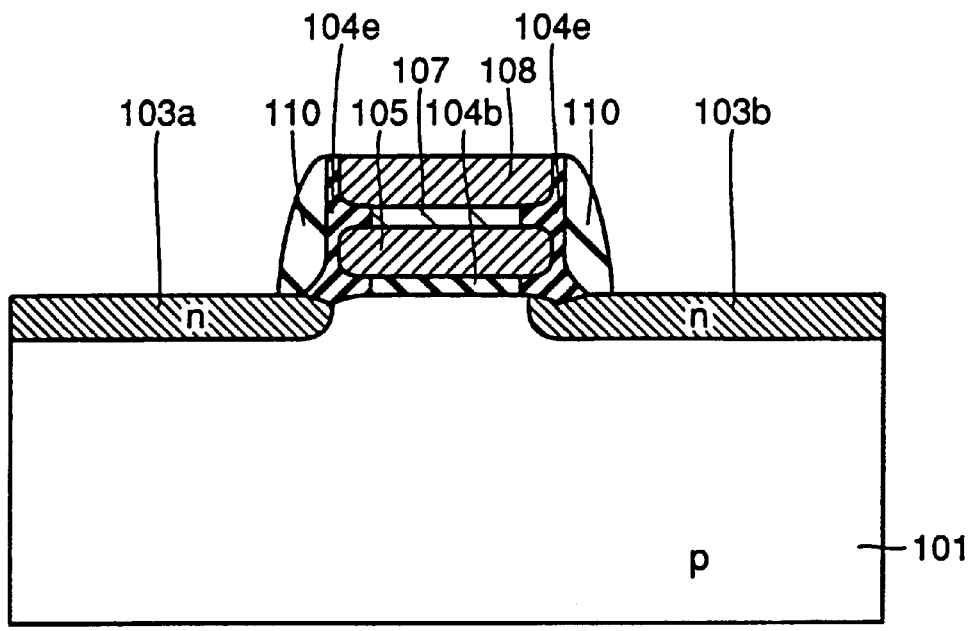
FIG. 47 is a cross sectional view showing the structure of a semiconductor device according to an eighth embodiment of the invention.

FIG. 47 is a cross sectional view schematically showing a flash EEPROM according to the eighth embodiment of the invention.

The structure of the flash EEPROM according to the eighth embodiment is substantially the same as that of the seventh embodiment shown in FIG. 40, with an essential difference being that the width of a nitrogen containing region provided on either end of low concentration nitrogen impurity region 104b is made thicker than that of low concentration nitrogen containing region 104b. The other structure is the same as that of the flash EEPROM according to the seventh embodiment, and therefore the same portions are denoted with the same reference numerals and characters.

Referring to FIGS. 48 to 53, a method of manufacturing the flash EEPROM according to the eighth embodiment of the invention will be described.

Figure 48:
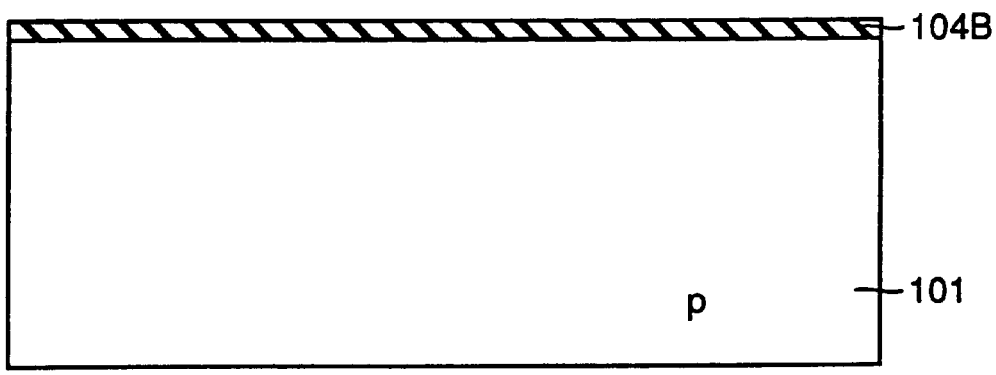
FIGS. 48 to 53 are cross sectional views showing first to fifth steps in a method of manufacturing the semiconductor device according to the eighth embodiment.

Referring to FIG. 48, a gate oxide film is formed by thermal oxidation on a surface of a p type semiconductor substrate 101, and a thermal treatment at a temperature in the range from 600° C. to 900° C. in an ammonia atmosphere follows to nitride the gate oxide film in order to form an oxynitride film 104B.

Figure 49:
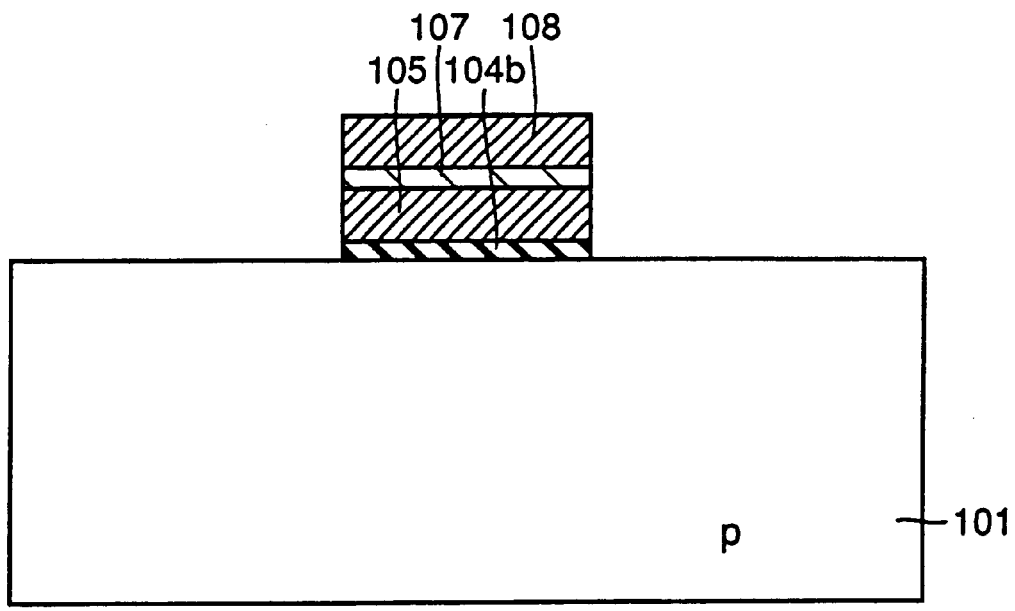

Referring to FIG. 49, a first polycrystalline silicon film doped with phosphorus is formed, on which an interlayer insulating film formed of a composite film of an oxide film and a nitride film is formed. Then, a second polycrystalline silicon film is formed on the interlayer insulating film.

Then, on the second polycrystalline silicon film, a resist film patterned into a prescribed shape is formed by means of photolithography, then using the resist film as mask, oxynitride film 104B, the first polycrystalline silicon film, the interlayer insulating film and the second polycrystalline silicon film are etched, and after removal of the resist film an oxynitride film 104b, a charge accumulating electrode 105, an interlayer insulating film 107 and a control electrode 108 are formed.

Figure 50:
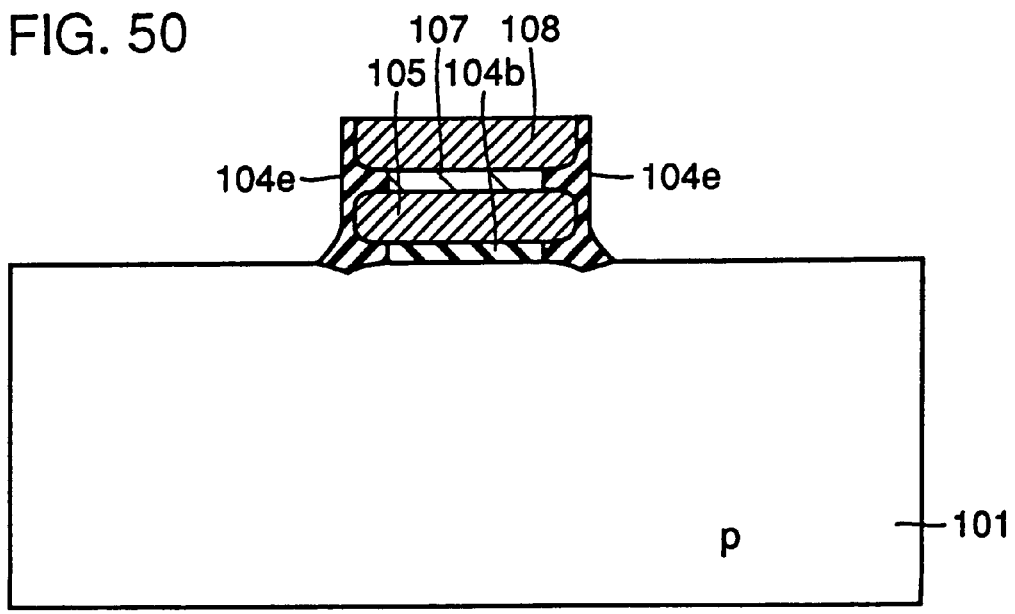

Referring to FIG. 50, a thermal treatment at about 1000° C. in an atmosphere containing nitrogen dioxide is conducted, and a nitrogen containing region 104e having a high nitrogen concentration is formed in an oxynitride film in the region in the vicinity of a lower edge portion of charge accumulating electrode 105. At the time, part of charge accumulating electrode 105 and part of semiconductor substrate 101 are oxidized by oxygen in the nitrogen dioxide, and the thickness of nitrogen containing region 104 in contact with the lower edge portion of charge accumulating electrode 105 becomes larger than low concentration nitrogen containing region 104b.

Figure 51:
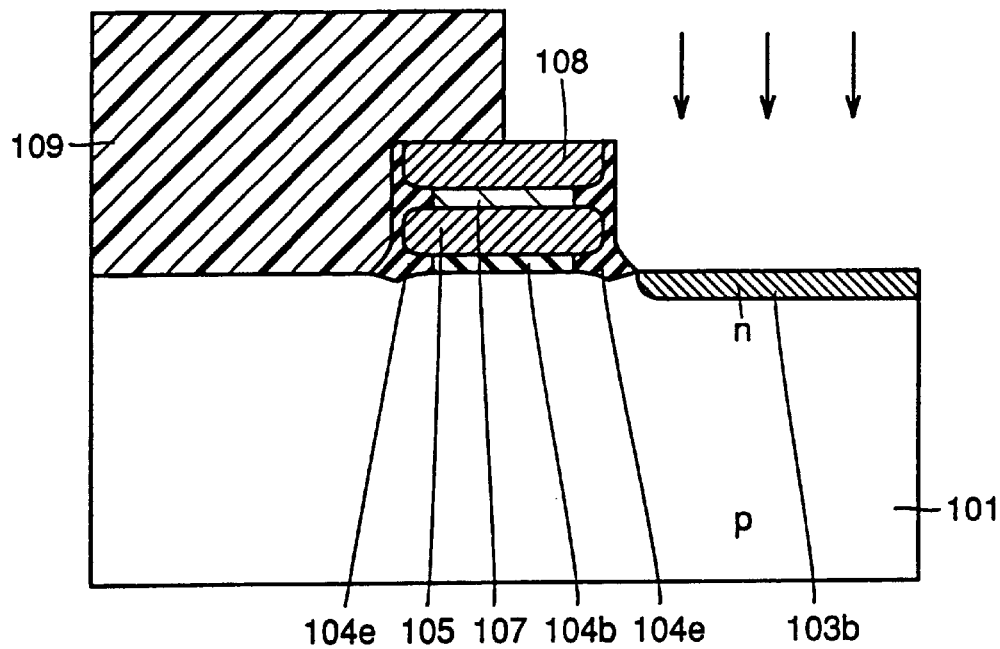

Referring to FIG. 51, a resist film 109 covering a region to be the n type drain diffusion region of the flash EEPROM is formed, using control electrode 108 and resist film 109 as mask, p type semiconductor substrate 101 is implanted with arsenic ions to form an n type source diffusion region 103b.

Figure 52:
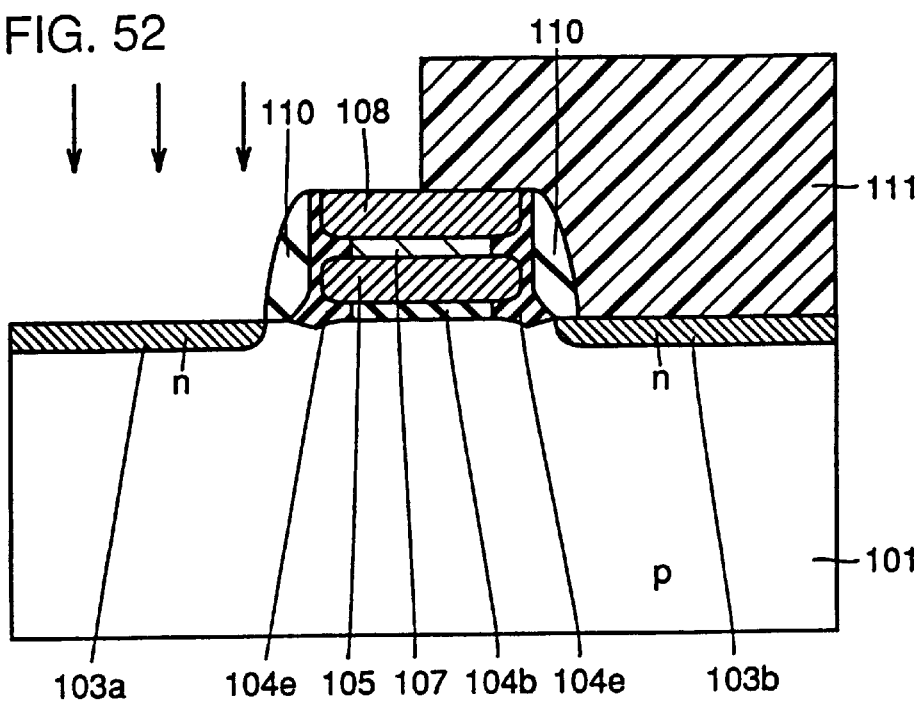
Figure 53:
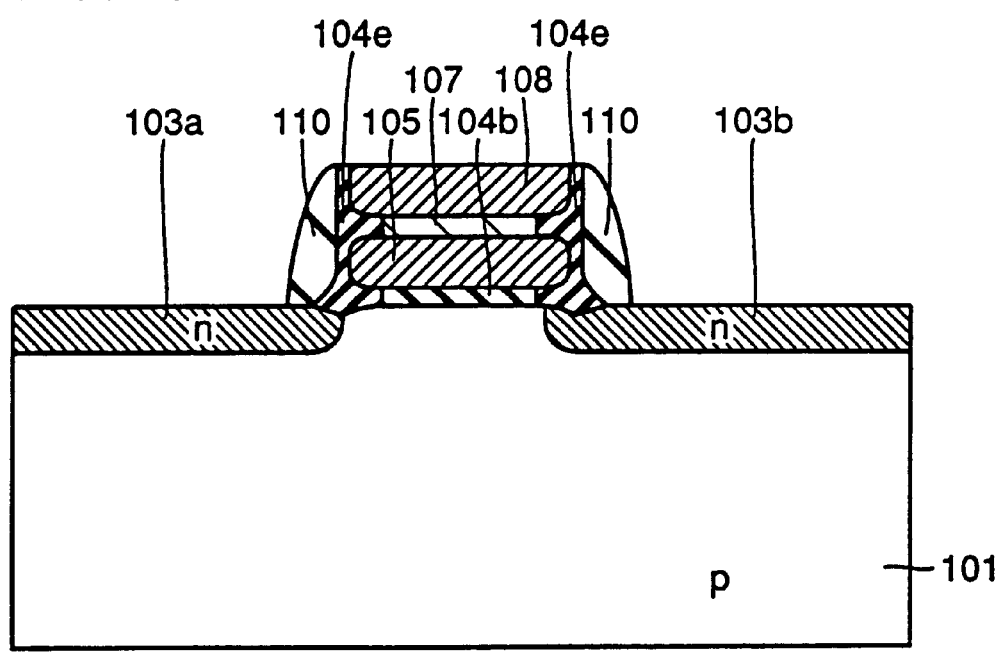

Referring to FIG. 52, after removal of resist film 109, a sidewall oxide film 110 is formed on sidewalls of charge accumulating electrode 105 and control electrode 108, then a resist film 111 covering n type source diffusion region 103b is formed, and using control electrode 108 and resist film 111 as mask, p type semiconductor substrate 101 is implanted with arsenic ions to form an n type drain diffusion region 103a. Referring to FIG. 53, after removal of resist film 111, thermal treatment is conducted to complete the flash EEPROM according to the eighth embodiment.

In the foregoing, nitrogen dioxide is used for oxynitriding the lower edge portion of the gate electrode in the gate oxide film, but the same structure may be obtained by a thermal treatment at about 900° C. in an atmosphere containing nitrogen monoxide or in an atmosphere containing at least two kinds of gas among nitrogen monoxide, nitrogen dioxide and ammonia.

In the flash EEPROM according to the eighth embodiment of the invention, the nitrogen containing region is formed only in the gate insulating film in the vicinity of the lower edge portion of the charge accumulating electrode, in other words only in the region through which electrodes tunnel at the time of writing and erasure.

As a result, a surface level is restrained from being generated between the gate insulating film at the lower edge portion of the charge accumulating electrode through which electrons tunnel and the p type semiconductor substrate, while carrier trap in the vicinity of the lower edge portion of the charge accumulating electrode in the gate insulating film may be reduced, so that the deterioration of the flash EEPROM caused by writing and erasure may be reduced.

Furthermore, since the nitrogen containing region is formed only on both ends of the gate insulating film, decrease in the mobility of carriers caused by nitriding the gate insulating film may be restrained. The gate oxide film at the edge portion of the gate electrode is oxidized by oxynitriding, in other words oxygen is introduced therein, and therefore damages given to the charge accumulating electrode by etching may be repaired. Therefore, a highly reliable flash EEPROM with high driving capability may be implemented.

Further in this embodiment the oxynitride film is used for the gate insulating film, the edge portion is oxynitrided, and therefore the nitrogen containing region has a higher nitrogen concentration than the central portion of the gate insulating film. As a result, the amount of charges injected until the insulating film breaks down may be increased, and the diffusion of dopant in the charge accumulating electrode into the silicon substrate may be restrained.

Ninth Embodiment

A semiconductor device according to a ninth embodiment of the invention and a manufacturing method thereof will be described with associated figures.

Figure 54:
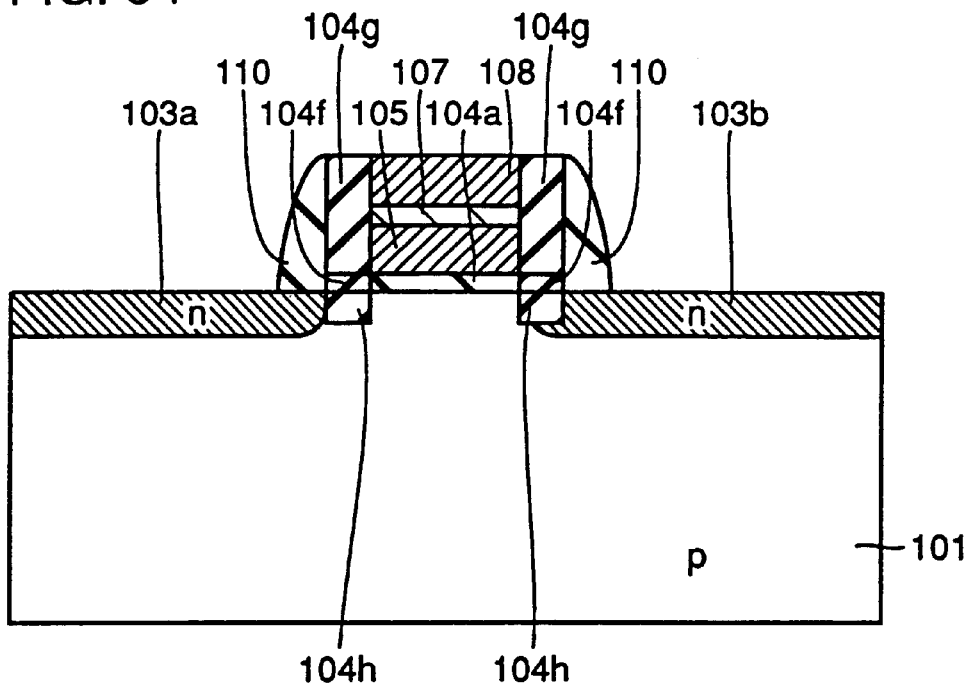
FIG. 54 is a cross sectional view showing the structure of a semiconductor device according to a ninth embodiment of the invention.

FIG. 54 is a cross section view schematically showing a flash EEPROM according to the ninth embodiment of the invention.

The structure of the flash EEPROM according to the ninth embodiment is substantially identical to that of the sixth embodiment shown in FIG. 33 with an essential difference being that a nitrogen impurity layer 104h is provided extending from nitrogen containing region 104d formed on both ends of gate insulating film 104a toward p type semiconductor substrate 101. The other structure is the same as that of the sixth embodiment, and therefore the same portions are denoted with the same reference numerals and characters.

Referring to FIGS. 55 to 60, a method of manufacturing the flash EEPROM according to the ninth embodiment of the invention will be described.

Figure 55:
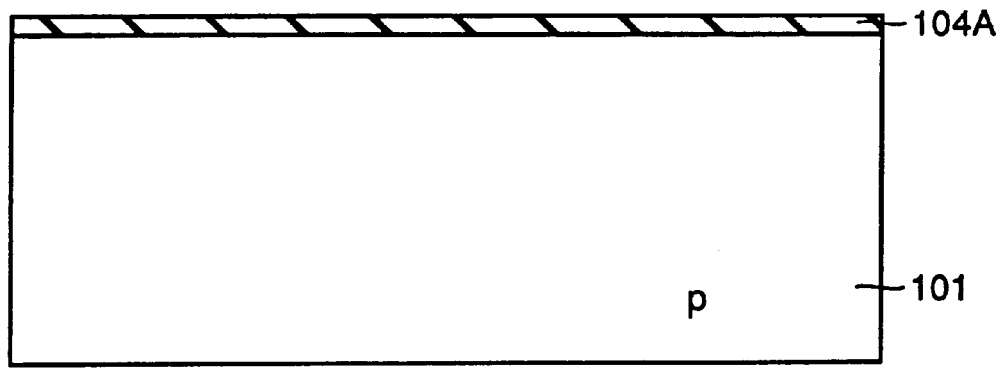
FIGS. 55 to 60 are cross sectional views showing first to sixth steps in a method of manufacturing the semiconductor device according to the ninth embodiment.

Referring to FIG. 55, a gate oxide film 104A is formed on a surface of a p type semiconductor substrate 101 by thermal oxidation.

Figure 56:
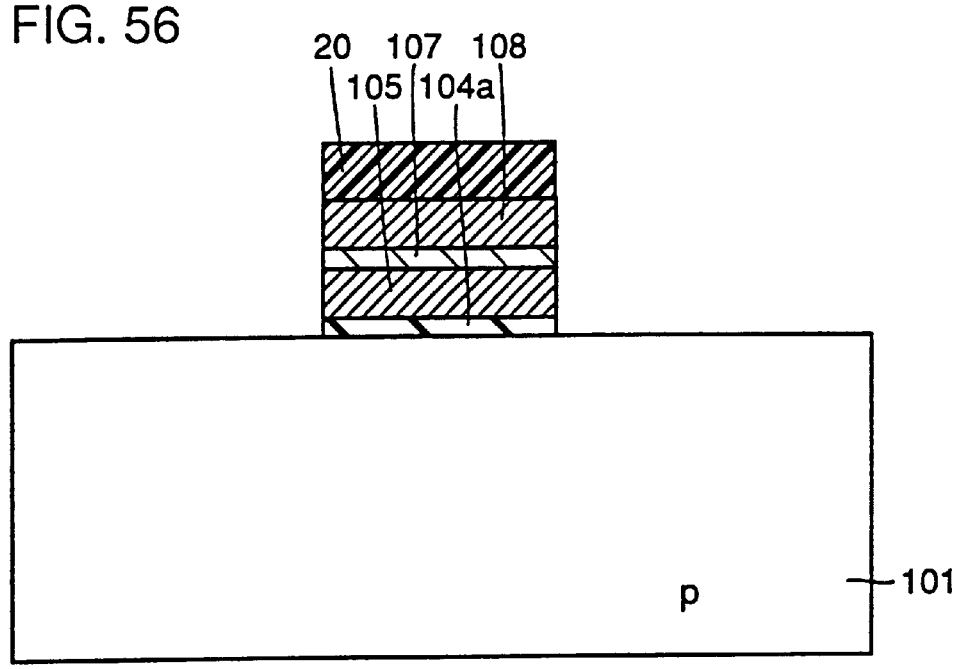

Referring to FIG. 56, a first polycrystalline silicon film doped with phosphorus is formed, on which an interlayer insulating film of a composite film of an oxide film and a nitride film is formed. Then, a second polycrystalline silicon film is formed on the interlayer insulating film.

A resist film patterned into a prescribed shape by means of photolithography is formed on the second polycrystalline silicon film, then using the resist film, gate oxide film 104A, the first polycrystalline silicon film, the interlayer insulating film and the second polycrystalline silicon film are etched, and the resist film is removed to complete a gate insulating film 104a, a charge accumulating electrode 105, an interlayer insulating film 107 and a control electrode 108.

Figure 57:
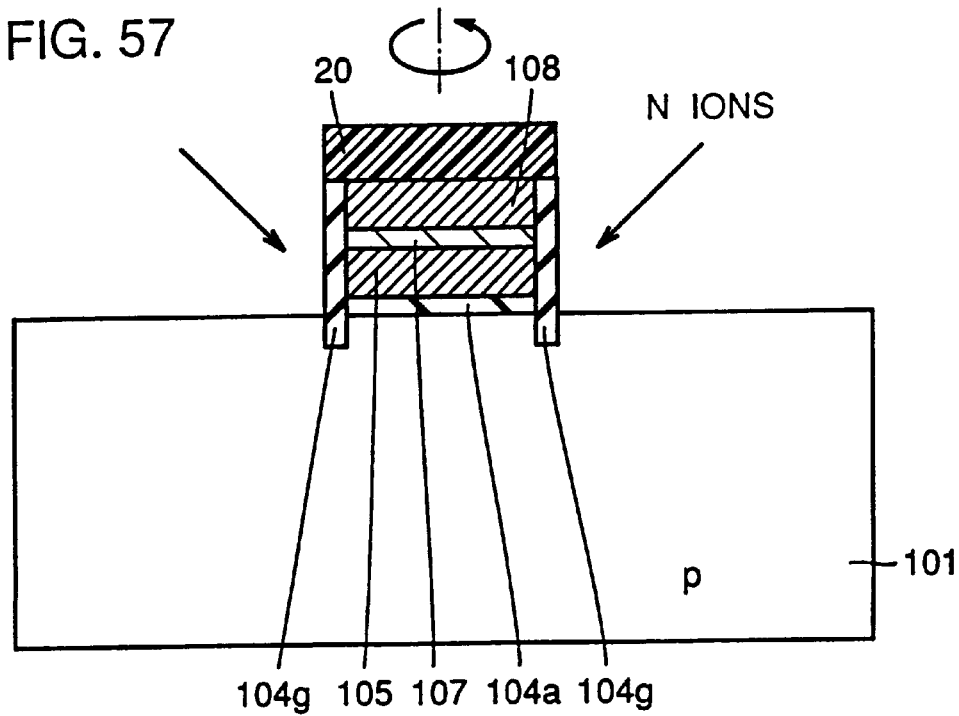

Referring to FIG. 57, with resist film 20 remaining, p type semiconductor substrate 101 is implanted with nitrogen ions from the position at an angle in the range from 30° to 40° with respect to the perpendicular on p type semiconductor substrate while rotating the substrate, and nitrogen is thus introduced to sidewalls of gate insulating film 104a, charge accumulating electrode 105 and control electrode 108 and into a prescribed depth of p type semiconductor substrate 101.

Figure 58:
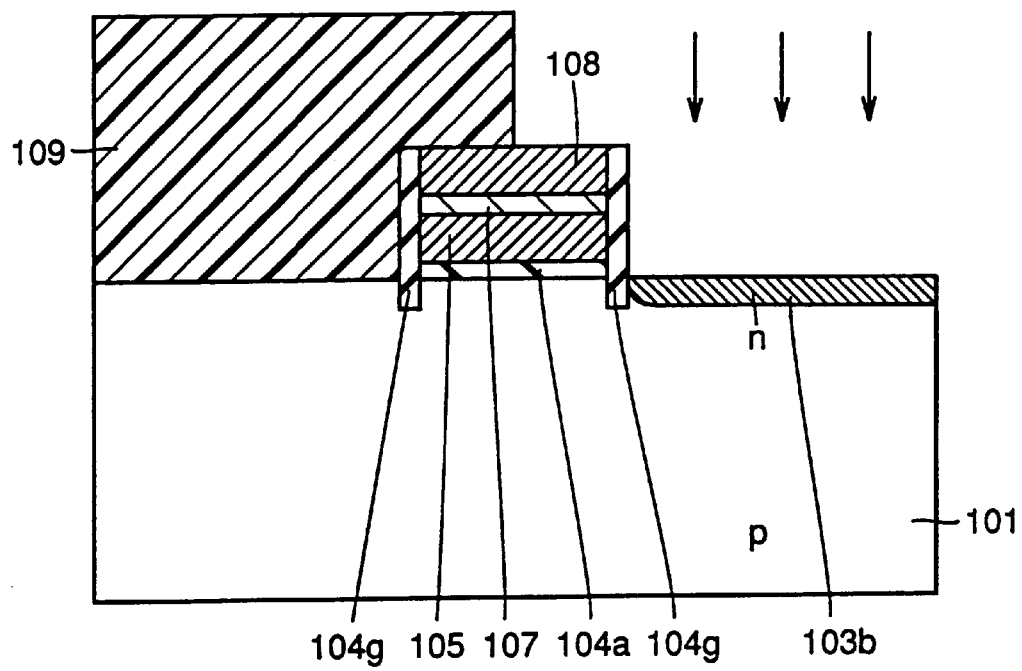

Referring to FIG. 58, a resist film 109 is formed to cover a region to be the n type drain diffusion region of the flash EEPROM, then using control electrode 108 and resist film 109 as mask, the surface of p type semiconductor substrate 101 is implanted with arsenic ions to form an n type source diffusion region 103b.

Figure 59:
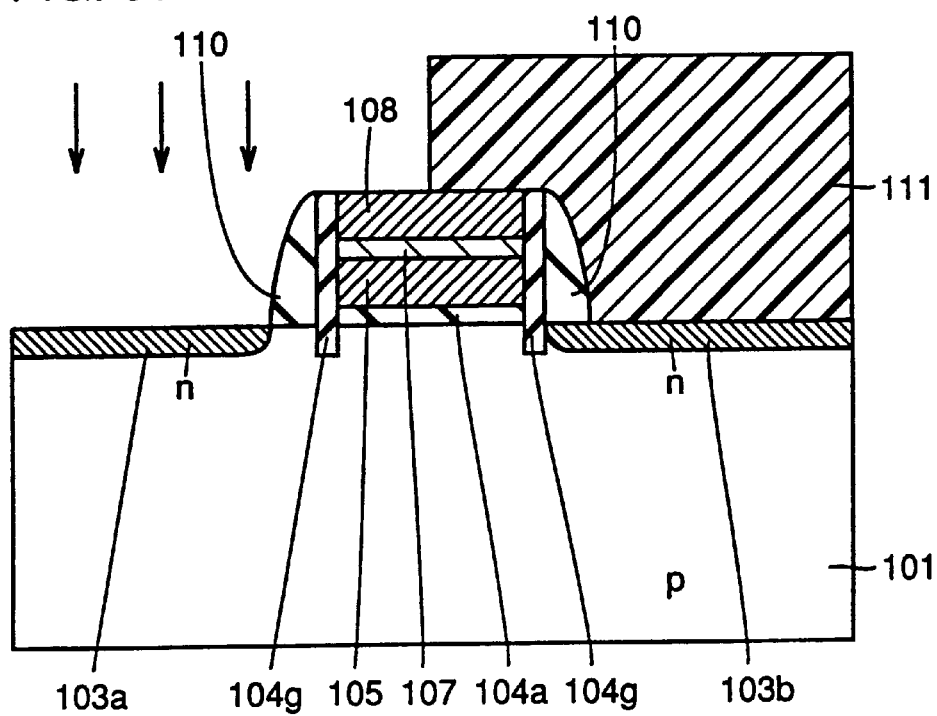

Referring to FIG. 59, after removal of resist film 109, a sidewall oxide film 110 is formed on sidewalls of charge accumulating electrode 105 and control electrode 108, then a resist film 111 covering an n type source diffusion region 103b is formed, and using control electrode 108 and resist film 111 as mask, the surface of p type semiconductor substrate 101 is implanted with arsenic ions to form an n type drain diffusion region 103a.

Figure 60:
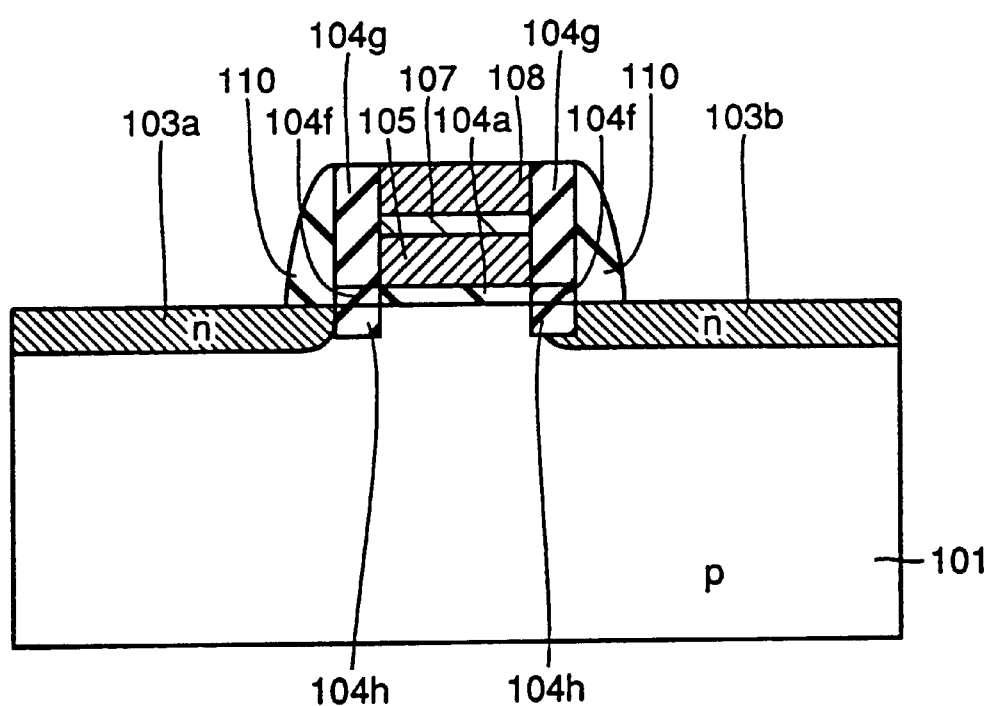

Then, referring to FIG. 60, after removal of resist film 111, thermal treatment is conducted to complete the flash EEPROM according to the ninth embodiment of the invention.

Note that by the thermal treatment, nitrogen at the sidewall portion of charge accumulating electrode 105, and the lower edge portion of charge accumulating electrode 105 in p type semiconductor substrate 101 precipitates at gate oxide film 104a, and therefore a high concentration nitrogen containing region 104f is formed.

In the flash EEPROM according to the ninth embodiment, the nitrogen containing region is formed only in the gate insulating film in the vicinity of the lower edge portion of the charge accumulating electrode, in other words only in the region through which electrons tunnel at the time of writing and erasure.

As a result, a surface level is restrained from being generated between the gate insulating film at the lower edge portion of the charge accumulating electrode through which electrons tunnel and the p type semiconductor substrate, while carrier trap in the vicinity of the lower edge portion of the charge accumulating electrode in the gate insulating film may be reduced, so that the deterioration of the flash EEPROM caused by writing and erasure may be reduced.

Further, since the nitrogen containing region is formed only on both ends of the gate insulating film, and therefore decrease in the mobility of carriers by nitriding the gate insulating film may be restrained. Since the nitriding of the gate insulating film is conducted by ion implantation and a step of thermal treatment for activating source/drain, a simple process with only one additional step of ion implantation may be employed to provide a highly reliable flash EEPROM with high driving capability.

Tenth Embodiment

A semiconductor device according to a tenth embodiment of the invention and a manufacturing method thereof will be described in conjunction with associated figures.

Figure 61:
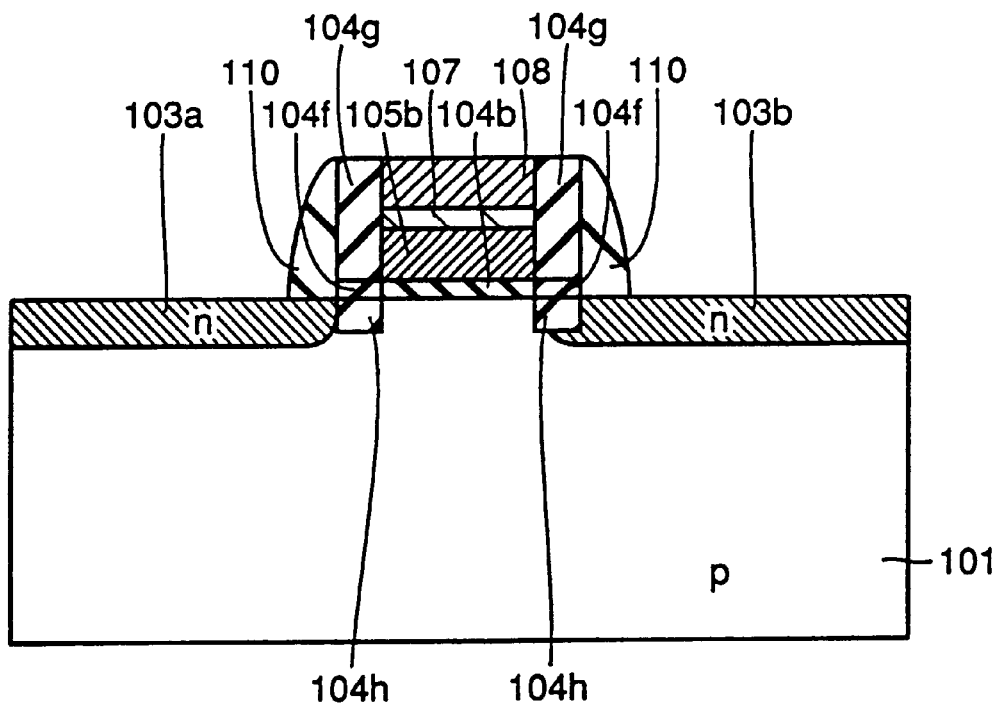
FIG. 61 is a cross sectional view showing the structure of a semiconductor device according to a tenth embodiment of the invention.

FIG. 61 is a cross sectional view schematically showing a flash EEPROM according to the tenth embodiment of the invention.

The structure of the flash EEPROM according to the tenth embodiment is substantially identical to that of the ninth embodiment shown in FIG. 54 with an essential difference being that in the tenth embodiment, a low concentration nitrogen containing region 104b containing nitrogen in a lower concentration than nitrogen containing region 104f is formed also in the region between nitrogen containing regions 104f, and that charge accumulating electrode 105b also contains nitrogen. The other structure is the same as that of flash EEPROM according to the ninth embodiment, and therefore the same portions are denoted with the same reference numerals and characters.

Referring to FIGS. 62 to 68, a method of manufacturing the flash EEPROM according to the tenth embodiment of the invention will be described.

Figure 62:
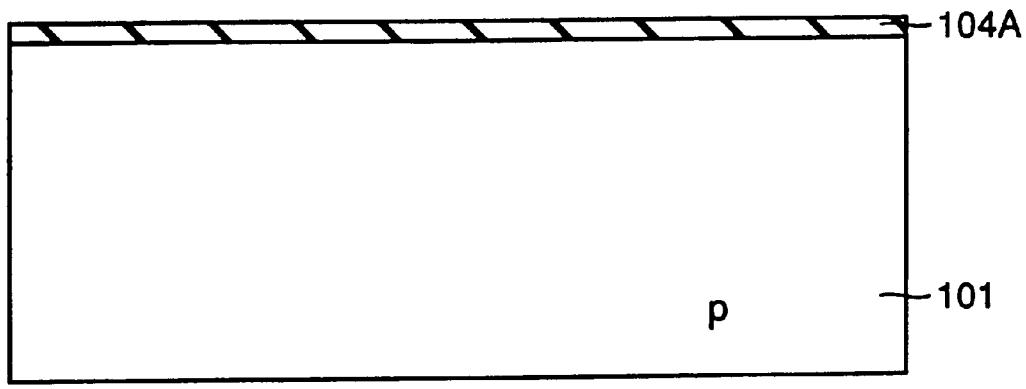
FIGS. 62 to 68 are cross sectional views showing first to seventh steps in a method of manufacturing the semiconductor device according to the tenth embodiment.

Referring to FIG. 62, a gate oxide film 104A is formed on a surface of a p type semiconductor substrate 101 by thermal oxidation.

Figure 63:
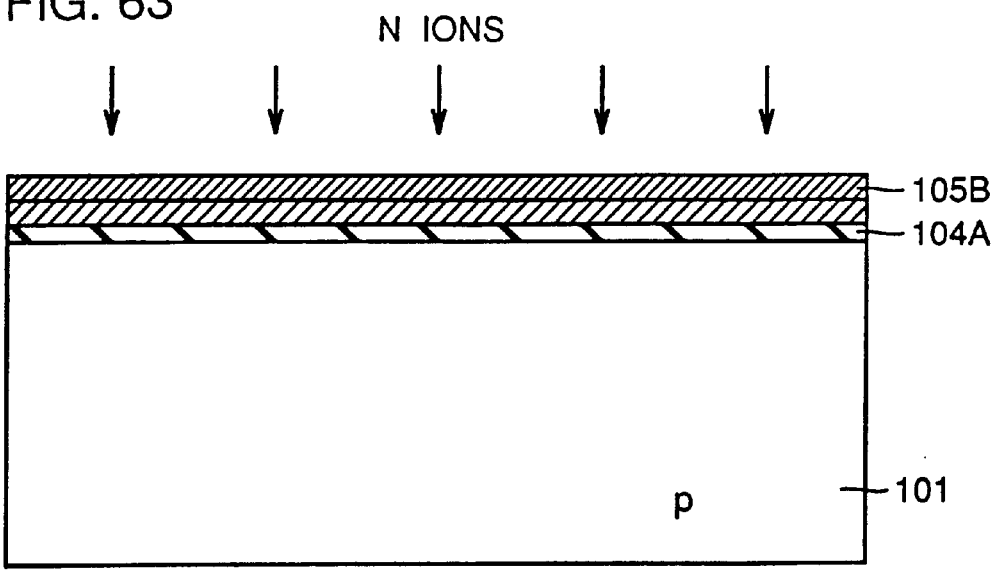

Referring to FIG. 63, a first polycrystalline silicon film doped with phosphorus is formed on gate oxide film 104A, and in an upper layer of the first polycrystalline silicon film a first polycrystalline silicon film 105B implanted with nitrogen ions is formed.

Figure 64:
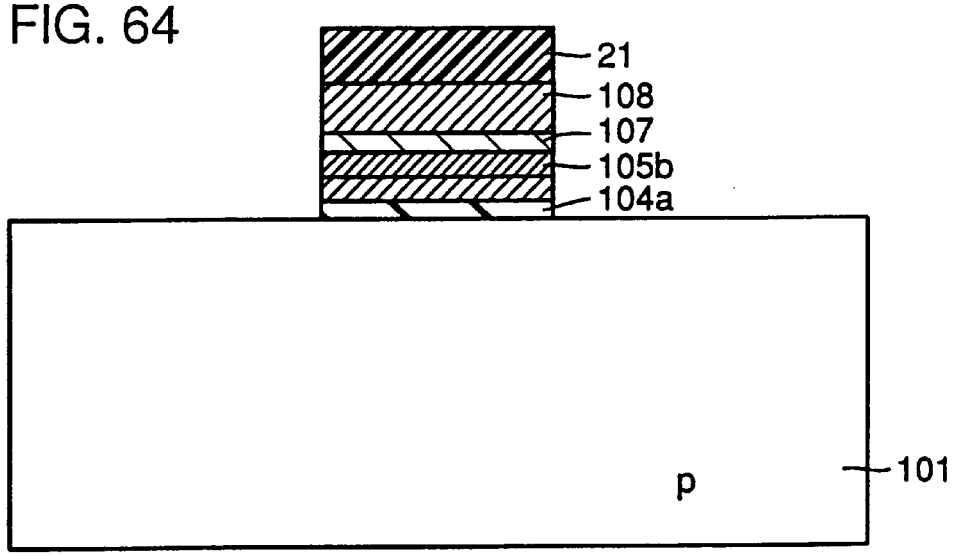

Referring to FIG. 64, an interlayer insulating film formed of a composite film of an oxide film and a nitride film is formed on first polycrystalline silicon film 105B, and then a second polycrystalline silicon film is formed on the interlayer insulating film.

A resist film 21 patterned into a prescribed shape by means of photolithography is formed on the second polycrystalline silicon film, then using resist film 21 as mask, gate oxide film 104A, first polycrystalline silicon film 105B, the interlayer insulating film and the second polycrystalline silicon film are patterned to complete a gate insulating film 104a, a charge accumulating electrode 105b, an interlayer insulating film 107, and a control electrode 108.

Figure 65:
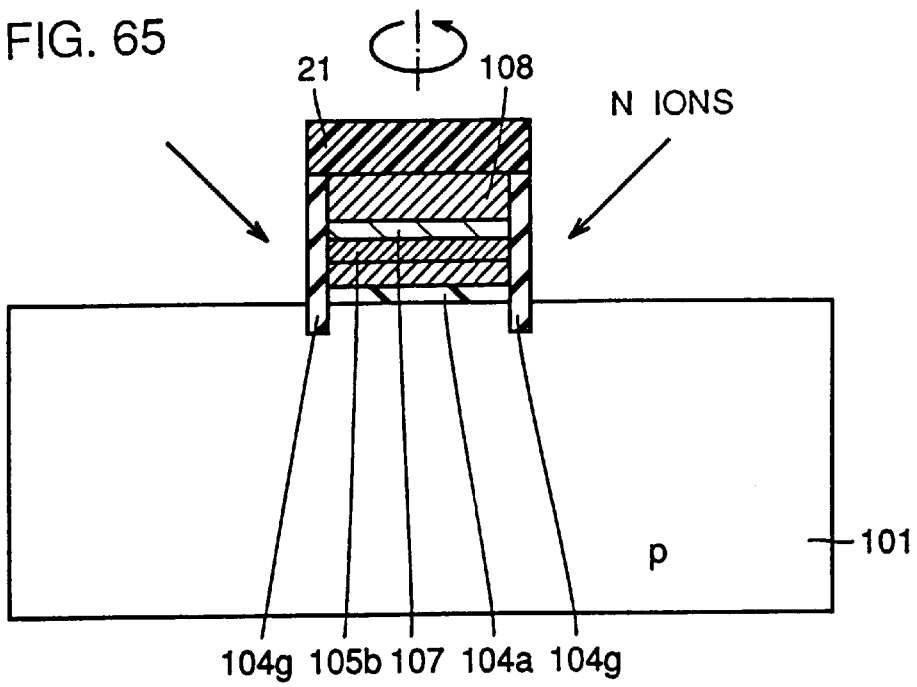

Referring to FIG. 65, with resist film 21 remaining, semiconductor substrate 101 is implanted with nitrogen ions from the position at an angle in the range from 30° to 40° with respect to the perpendicular on semiconductor substrate 101 while turning the substrate, and a nitrogen introduced region 104g is formed on sidewalls of gate insulating film 104a, charge accumulating electrode 105b and control electrode 108 and to a prescribed depth of p type semiconductor substrate 101.

Figure 66:
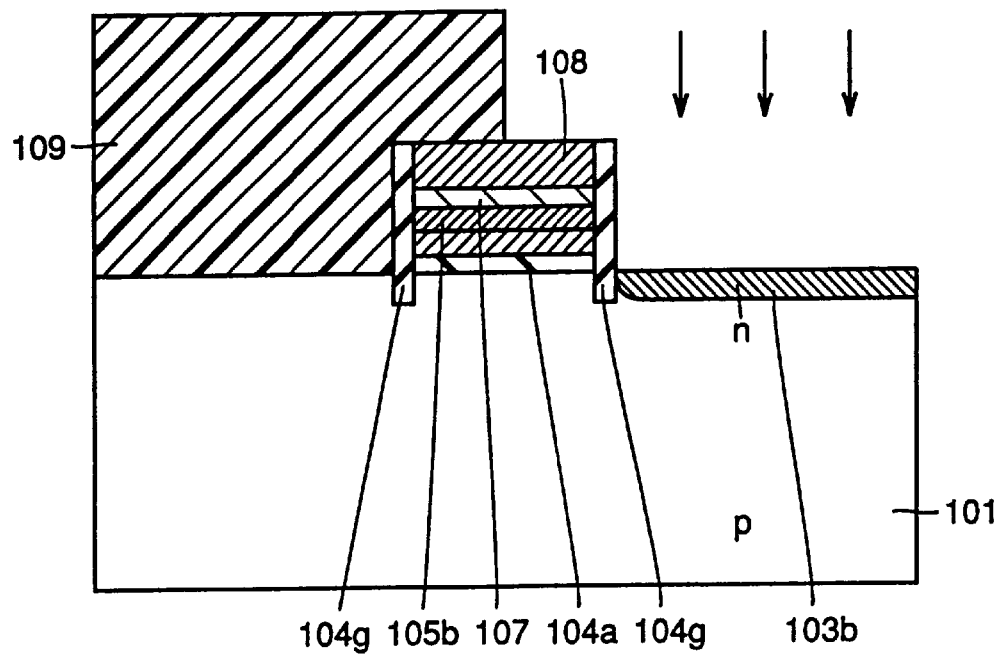

Referring to FIG. 66, a resist film 109 is formed covering a region to be the n type drain diffusion region of the flash EEPROM, using control electrode 108 and resist film 109 as mask, p type semiconductor substrate 101 is implanted with arsenic ions to form an n type source diffusion region 103b.

Figure 67:
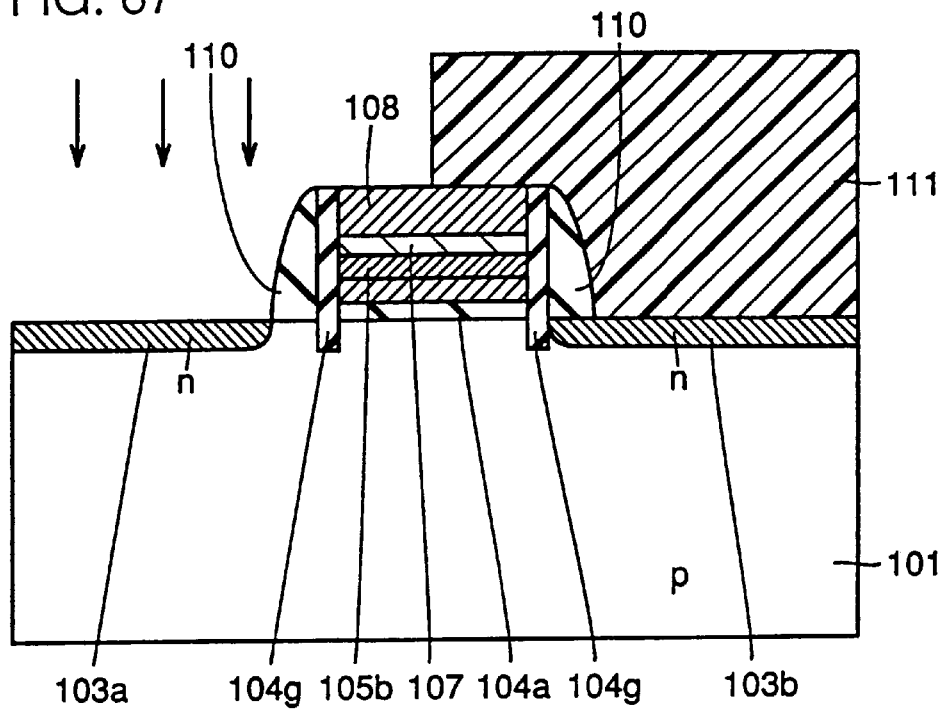

Referring to FIG. 67, after removal of resist film 109, a sidewall oxide film 110 is formed on sidewalls of charge accumulating electrode 105b and control electrode 108, then a resist film 111 is formed to cover an n type source diffusion region 103b, and using control electrode and resist film 111 as mask, p type semiconductor substrate 101 is implanted with arsenic ions to form an n type drain diffusion region 103a.

Figure 68:
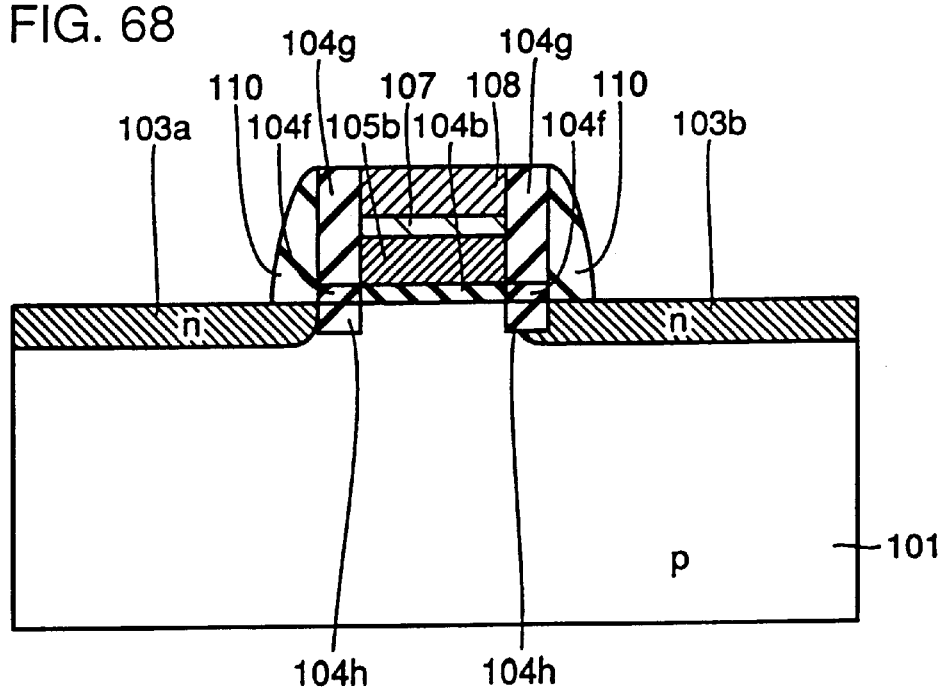
Figure 69:
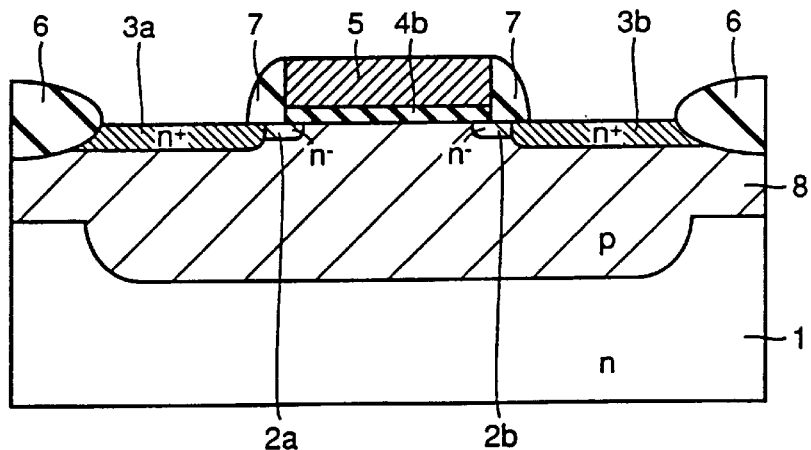
FIG. 69 is a cross sectional view showing the structure of a conventional MOSFET.
Figure 70:
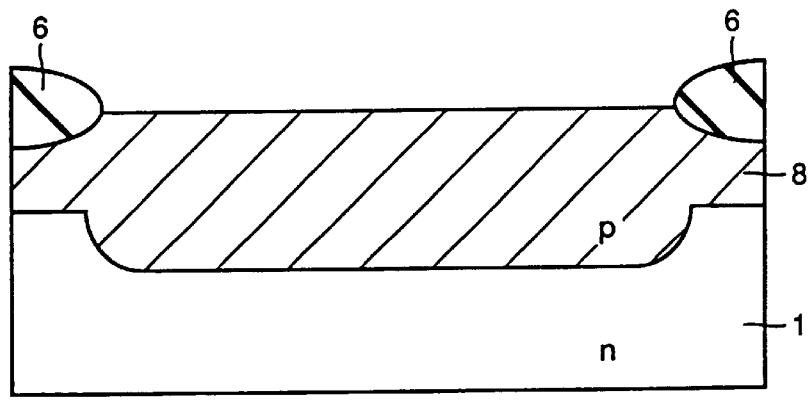
FIGS. 70 to 73 are cross sectional views showing first to fourth steps in a method of manufacturing the conventional MOSFET.
Figure 71:
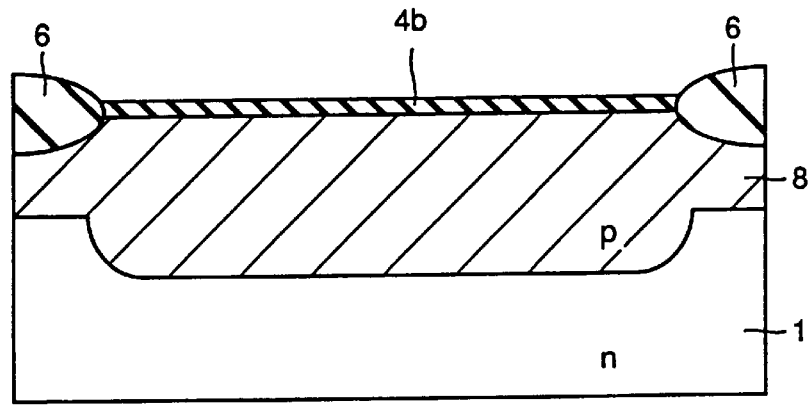
Figure 72:
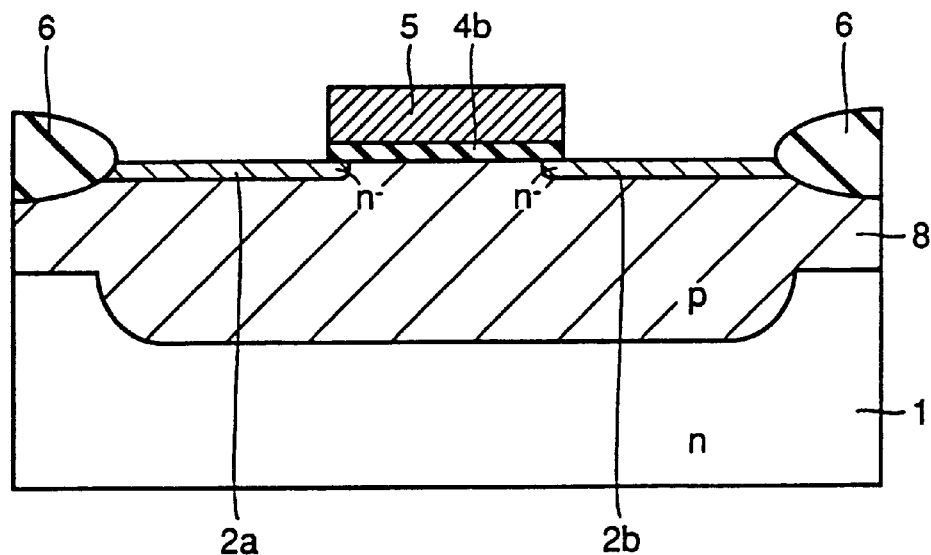
Figure 73:
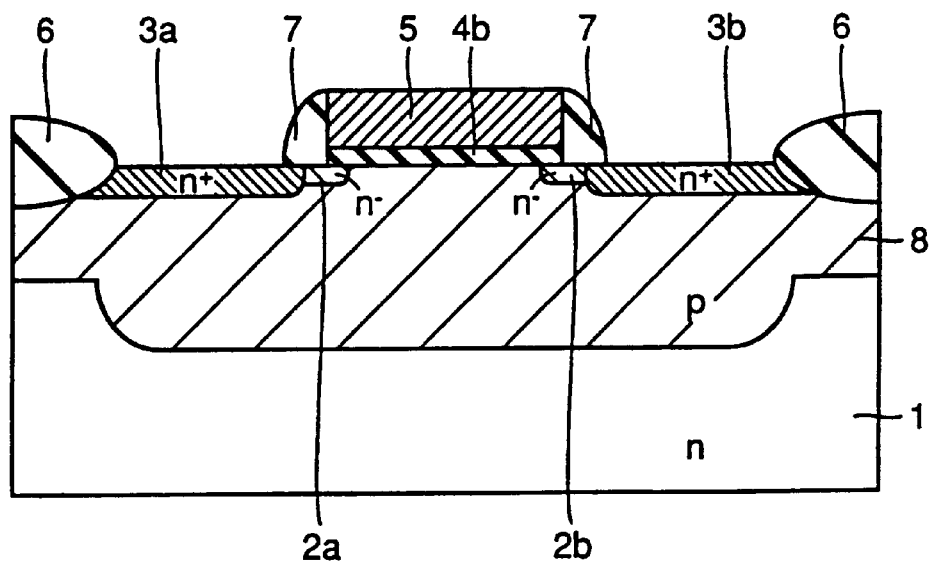
Figure 74:
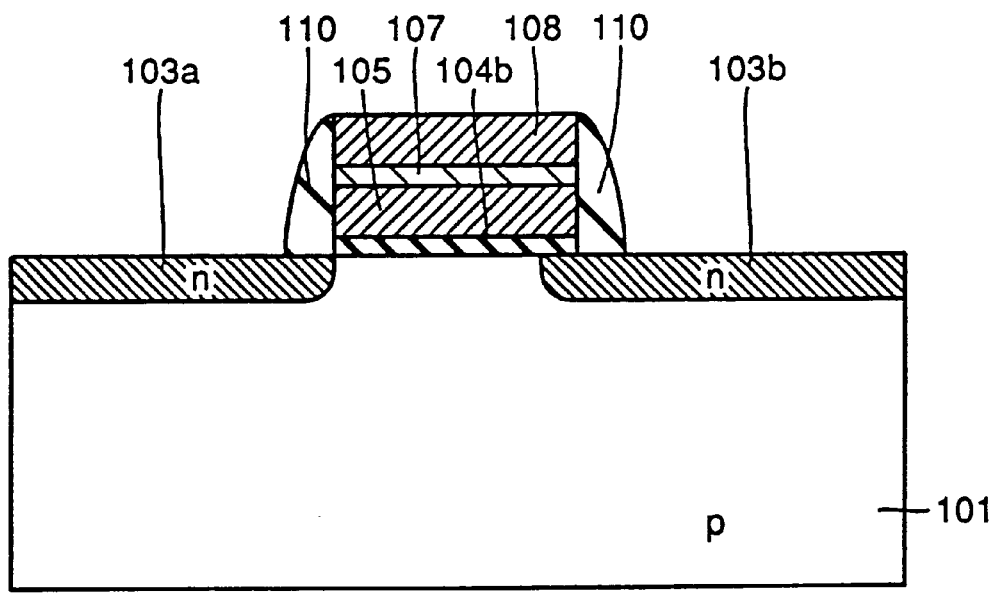
FIG. 74 is a cross sectional view showing the structure of a conventional flash EEPROM.
Figure 75:
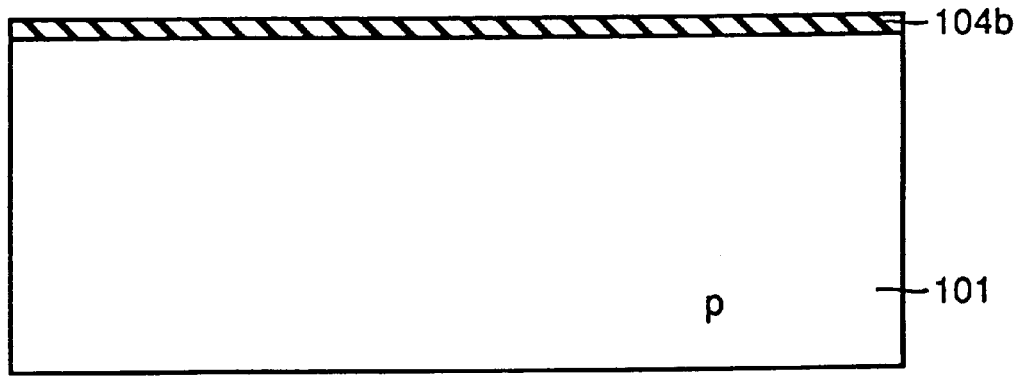
FIGS. 75 to 79 are cross sectional views showing first to fifth steps in a method of manufacturing the conventional flash EEPROM.
Figure 76:
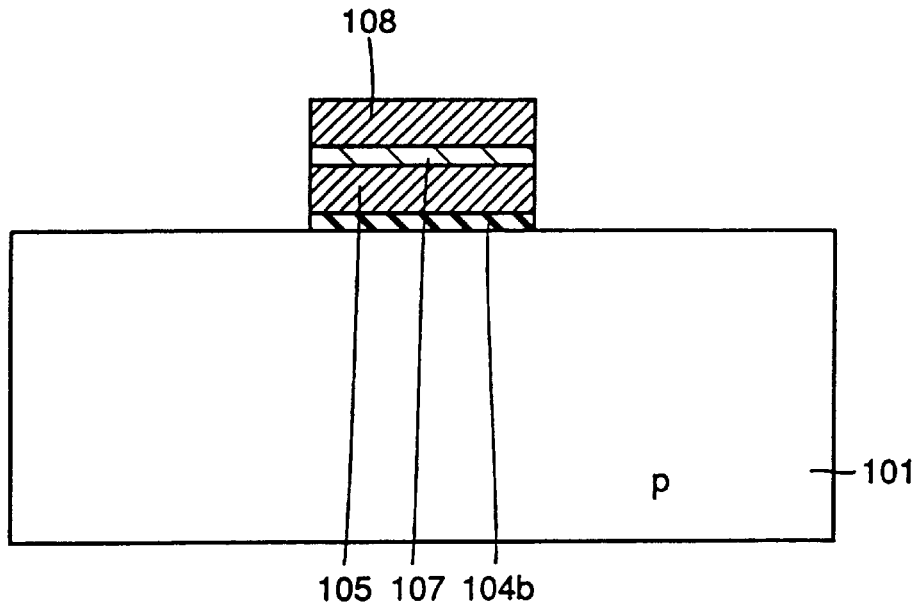
Figure 77:
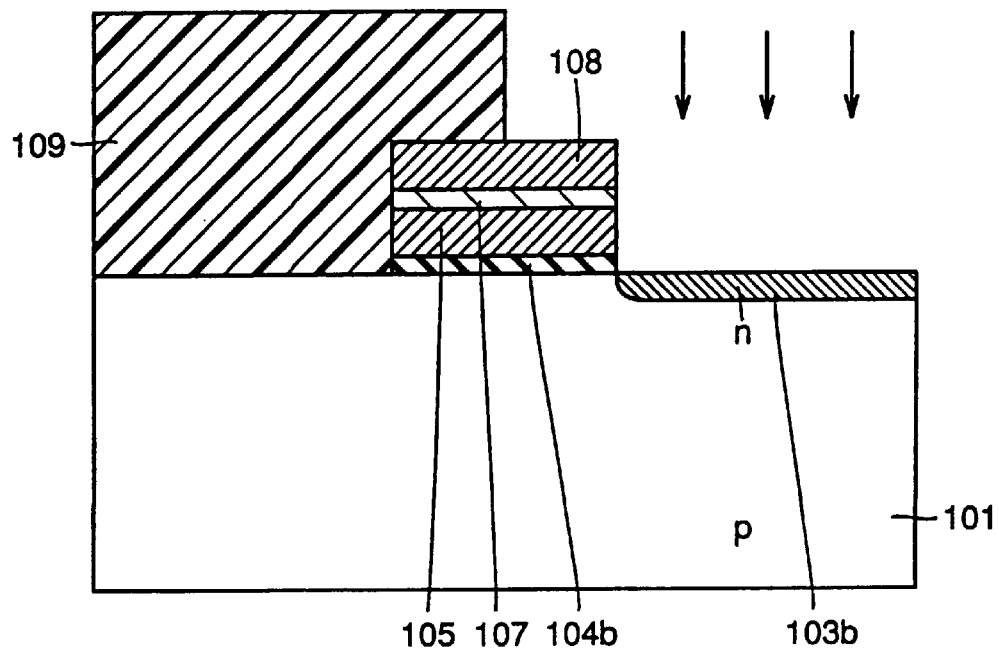
Figure 78:
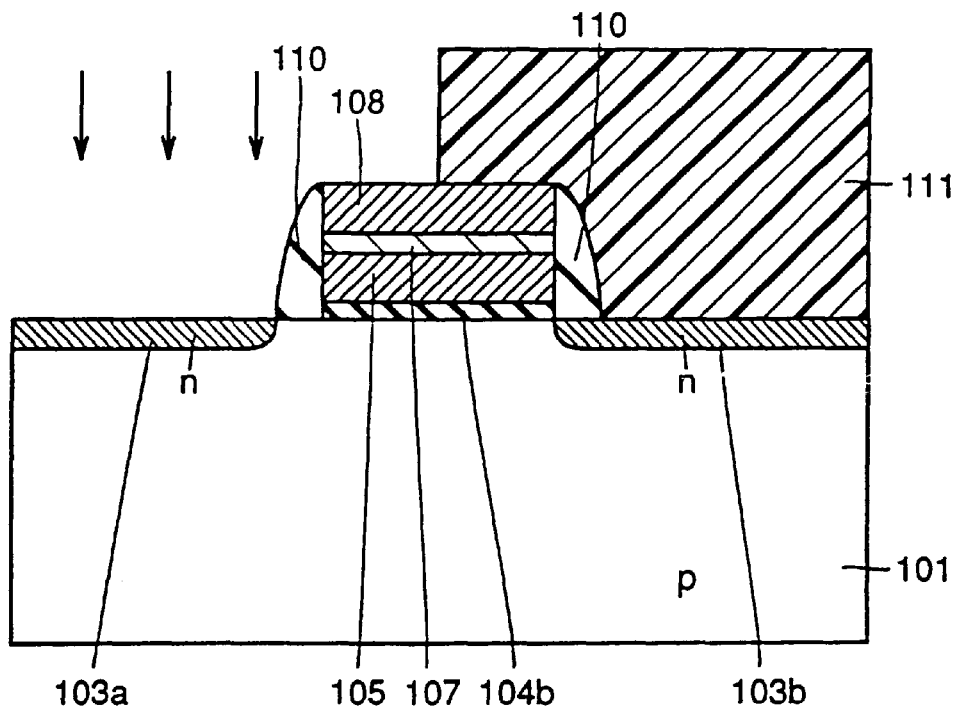
Figure 79:
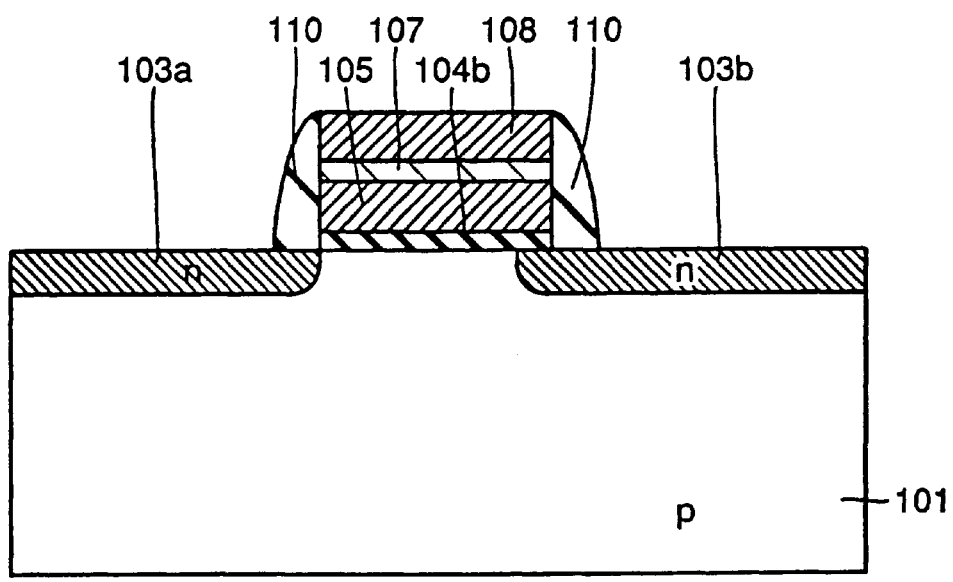

Then, after removal of resist film 111 as shown in FIG. 68, thermal treatment is conducted to complete the flash EEPROM according to the tenth embodiment of the invention.

Note that by the thermal treatment, nitrogen within charge accumulating electrode 105b and at the lower edge portion of charge accumulating electrode 105 in p type semiconductor substrate 101 precipitates at the gate oxide film. Thus, a low concentration nitrogen containing region 104b is formed at the central portion of the gate oxide film, and a nitrogen containing region 104f having a higher nitrogen concentration than low concentration nitrogen containing region 104b is formed on each end portion of the gate oxide film.

In the semiconductor device according to the tenth embodiment of the invention, the nitrogen containing region containing a large amount of nitrogen is formed in the gate insulating film in the vicinity of the lower edge of the charge accumulating electrode, in other words in the region through which electrons tunnel at the time of writing and erasure. As a result, a surface level is restrained from being generated between the gate insulating film at the lower edge of the charge accumulating electrode through which electrons tunnel and the semiconductor substrate, while carrier trap in the vicinity of the lower edge of the charge accumulating electrode in the gate insulating film may be reduced, and therefore, the deterioration of the flash EEPROM caused by writing and erasure may be reduced.

In addition, since the nitrogen containing region is formed only on both end portions of the gate insulating film, decrease in the mobility of carriers caused by nitriding the gate insulating film may be restrained. The nitriding of the gate insulating film is conducted by ion implantation and thermal treatment for activating source/drains, and therefore a simple process with only two additional steps of ion implantation permits a highly reliable flash EEPROM with high driving capability to be readily implemented.

Note that in the above-described first to fifth embodiments, the methods of manufacturing the n channel type MOSFET are described, but the type of conductivity of the dopant may be changed to form a p channel type MOSFET. Selective doping may permit an application to a CMOS structure.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

forming an insulating film, consisting essentially of oxide or oxynitride, on a main surface of a semiconductor substrate of first type conductivity;

forming a first electrode on said insulating film;

patterning said insulating film and said first electrode into a prescribed shape by means of a photolithography technique;

introducing an impurity of second type conductivity opposite to said first type conductivity to said semiconductor substrate using said first electrode as mask, thereby forming a pair of impurity regions; and conducting a thermal treatment in an atmosphere containing gas including nitrogen subsequent to patterning said insulating film, thereby forming two spaced apart nitrogen-containing regions, one on each end portion of said insulating film.

2. The method of manufacturing a semiconductor device as recited in claim 1, wherein said step of forming said first electrode includes a step of forming a second electrode on said first electrode with an interlayer insulating film inbetween, said step of patterning the first electrode includes a step of patterning said second electrode at the same time, and said step of forming said pair of impurity regions includes a step of implanting an impurity of said second type conductivity, using said second electrode as mask as well.

3. The method of manufacturing a semiconductor device as recited in claim 1, wherein said step of forming said insulating film allows said insulating film to include nitrogen in a concentration lower than that of said nitrogen containing region.

4. The method of manufacturing a semiconductor device as recited in claim 3, wherein said gas containing the nitrogen gas is at least one kind of gas selected from the group consisting of nitrogen monoxide, nitrogen dioxide and ammonia, and said step of thermal treatment forms nitrogen containing regions on both end portions of said insulating film by a thermal treatment at a temperature of about 800° C.

5. The method of manufacturing a semiconductor device as recited in claim 3, wherein said heat treatment step using said gas containing nitrogen is one of a heat treatment at about 900° C. with nitrogen monoxide and a heat treatment at about 1000° C. with nitrogen dioxide.

6. A method of manufacturing a semiconductor device, comprising the sequential steps of:

forming an insulating, consisting essentially of oxide or oxynitride, film on a main surface of a semiconductor substrate of first type conductivity;

forming a first electrode on said insulating film;

forming a resist film of a prescribed shape on said first electrode by means of a photolithography technique and patterning said insulating film and said first electrode using said resist film as mask;

implanting said semiconductor substrate in contact with said first electrode, a sidewall of said first electrode and a sidewall of said insulating film with nitrogen to form a nitrogen implanted region, by means of oblique ion implantation rotation method while said resist film remaining;

after removal of said resist film, introducing an impurity of second type conductivity opposite to said first conductivity into said semiconductor substrate using said first electrode as mask to form a pair of impurity regions; and thermally treating said nitrogen-implanted region, thereby forming two spaced apart nitrogen-containing regions, one on each end portion of said insulating film.

7. The method of manufacturing a semiconductor device as recited in claim 6, wherein said step of forming said first electrode on said insulating film further includes a step of forming a nitrogen implanted region by implanting nitrogen into an upper layer portion of said first electrode.

8. The method of manufacturing a semiconductor device as recited in claim 6, wherein said step of forming said first electrode includes a step of forming a second electrode on said first electrode with an interlayer insulating film therebetween, said step of patterning said first electrode includes a step of patterning said second electrode at the same time, and said step of forming said pair of impurity regions includes a step of implanting an impurity of said second type conductivity using said second electrode as mask as well.

* * * * *

UNITED STATES PATENT AND TRADEMARK OFFICE
CERTIFICATE OF CORRECTION

PATENT NO.    : 6,232,187 B1
DATED         : May 15, 2001
INVENTOR(S)   : Takashi Kuroi et al.

Page 1 of 1

It is certified that error appears in the above-identified patent and that said Letters Patent is hereby corrected as shown below:

<u>Column 22, claim 6,</u>
Line 3, after "insulating", insert -- film --;
Line 4, delete "film".

Signed and Sealed this

Eighth Day of January, 2002

Attest:

Attesting Officer

JAMES E. ROGAN
*Director of the United States Patent and Trademark Office*